(12) United States Patent
Sakai

(10) Patent No.: US 12,501,755 B2
(45) Date of Patent: Dec. 16, 2025

(54) LIGHT-EMITTING DEVICE, LIGHT SOURCE DEVICE, AND METHOD FOR MANUFACTURING LIGHT-EMITTING DEVICE

(71) Applicant: NICHIA CORPORATION, Anan (JP)

(72) Inventor: Kazuaki Sakai, Tokushima (JP)

(73) Assignee: NICHIA CORPORATION, Anan (JP)

( * ) Notice: Subject to any disclaimer, the term of this patent is extended or adjusted under 35 U.S.C. 154(b) by 519 days.

(21) Appl. No.: 17/987,012

(22) Filed: Nov. 15, 2022

(65) Prior Publication Data

US 2023/0155095 A1    May 18, 2023

(30) Foreign Application Priority Data

Nov. 16, 2021  (JP) .................. 2021-186697
Oct. 28, 2022  (JP) .................. 2022-173751

(51) Int. Cl.
*H10H 20/857*   (2025.01)
*H01L 25/075*   (2006.01)
(Continued)

(52) U.S. Cl.
CPC ....... *H10H 20/857* (2025.01); *H01L 25/0753* (2013.01); *H10H 20/01* (2025.01);
(Continued)

(58) Field of Classification Search
CPC .... H10H 20/857; H10H 20/01; H10H 20/854; H10H 20/0362; H10H 20/0364; H01L 25/0753

See application file for complete search history.

(56) References Cited

U.S. PATENT DOCUMENTS 5,981,979 A    11/1999 Brunner
2002/0101734 A1  8/2002 Tokida et al.
(Continued)

FOREIGN PATENT DOCUMENTS

JP    57-197657    12/1982
JP    61-210685     9/1986
(Continued)

OTHER PUBLICATIONS

Kitamura, JP 2003282958, Oct. 3, 2003 (Year: 2003).*
Mineshita, JP 2010040910, Feb. 18, 2010 (Year: 2010).*
Ishihara et al., WO 2013183693, Dec. 12, 2013 (Year: 2013).*

*Primary Examiner* — Mary Ellen Bowman
(74) *Attorney, Agent, or Firm* — MORI & WARD, LLP

(57) ABSTRACT

A light-emitting device includes a light-emitting element, a first lead, a second lead, and a mold resin member. The light-emitting element is mounted on the first lead. The second lead is electrically connected to the light-emitting element via a conductive member, and disposed away from the first lead along a first direction. The mold resin member directly or indirectly covers the light-emitting element. The mold resin member includes a lens portion located above the light-emitting element, a fixing portion configured to fix the first lead and the second lead, and an inclined portion. The inclined portion is located between the lens portion and the fixing portion, and the inclined portion has at least a portion spreading and inclined from a boundary between the inclined portion and the lens portion toward a boundary between the inclined portion and the fixing portion. The light-emitting element is disposed inside the fixing portion.

24 Claims, 18 Drawing Sheets

(51) Int. Cl.
    *H10H 20/01*     (2025.01)
    *H10H 20/854*    (2025.01)
(52) U.S. Cl.
    CPC ....... *H10H 20/854* (2025.01); *H10H 20/0362*
                (2025.01); *H10H 20/0364* (2025.01)

(56) References Cited

U.S. PATENT DOCUMENTS

| | | |
|---|---|---|
| 2004/0119668 A1 | 6/2004 | Homma et al. |
| 2005/0212089 A1 | 9/2005 | Kiyomoto et al. |
| 2023/0106437 A1* | 4/2023 | Sakai .................. H10H 20/856 257/91 |

FOREIGN PATENT DOCUMENTS

| | | |
|---|---|---|
| JP | S61-216491 | 9/1986 |
| JP | 63-133684 | 6/1988 |
| JP | 06-011365 | 1/1994 |
| JP | 11-087781 | 3/1999 |
| JP | 2002-094129 | 3/2002 |
| JP | 2002-134794 | 5/2002 |
| JP | 2002-231013 | 8/2002 |
| JP | 2002-231014 | 8/2002 |
| JP | 2003-209291 | 7/2003 |
| JP | 2003-282958 | 10/2003 |
| JP | 2004-186092 | 7/2004 |
| JP | 2008-010740 | 1/2008 |
| JP | 2009-224795 | 10/2009 |
| JP | 2010-040910 | 2/2010 |
| JP | 5384871 B2 * | 1/2014 |
| WO | WO 03/083810 | 10/2003 |

* cited by examiner

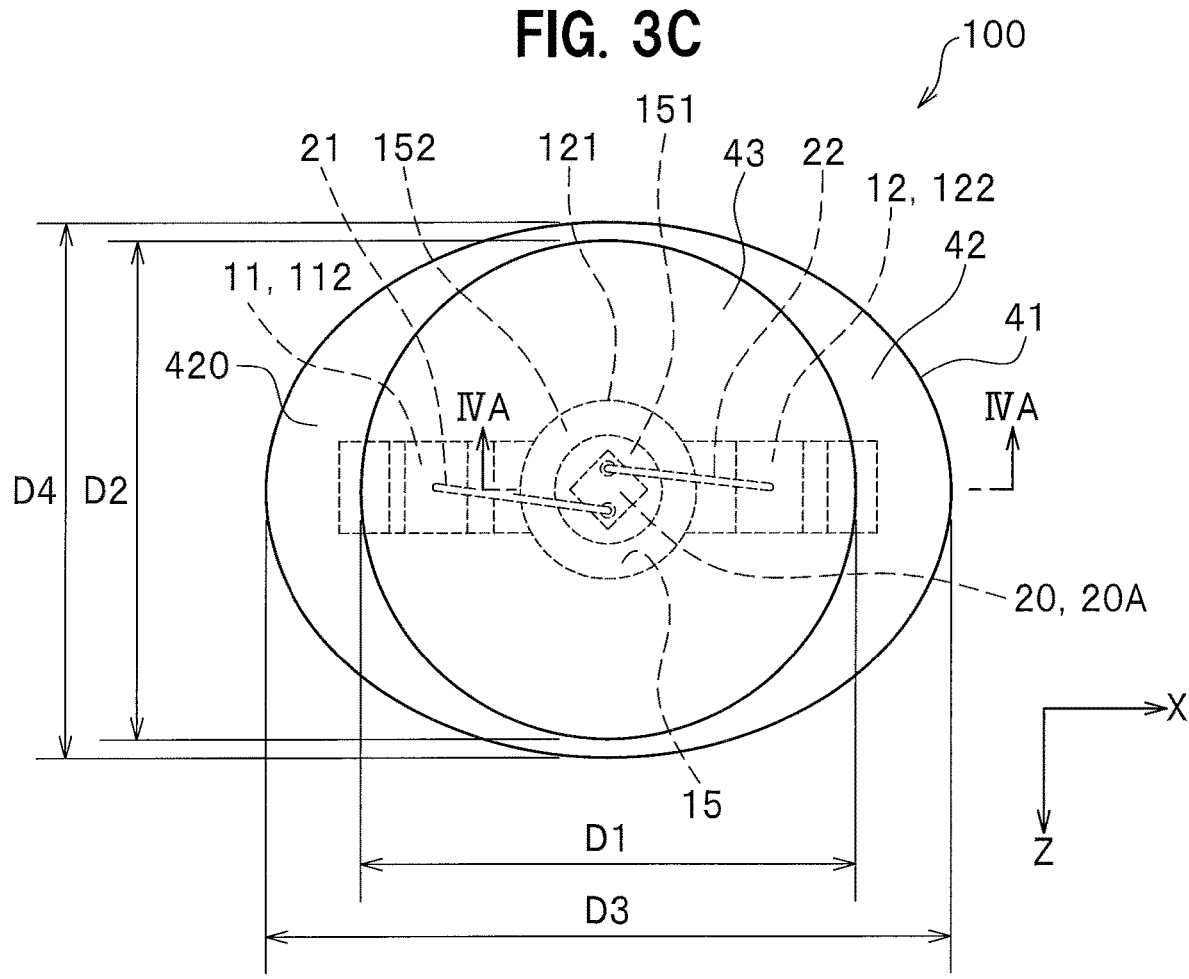

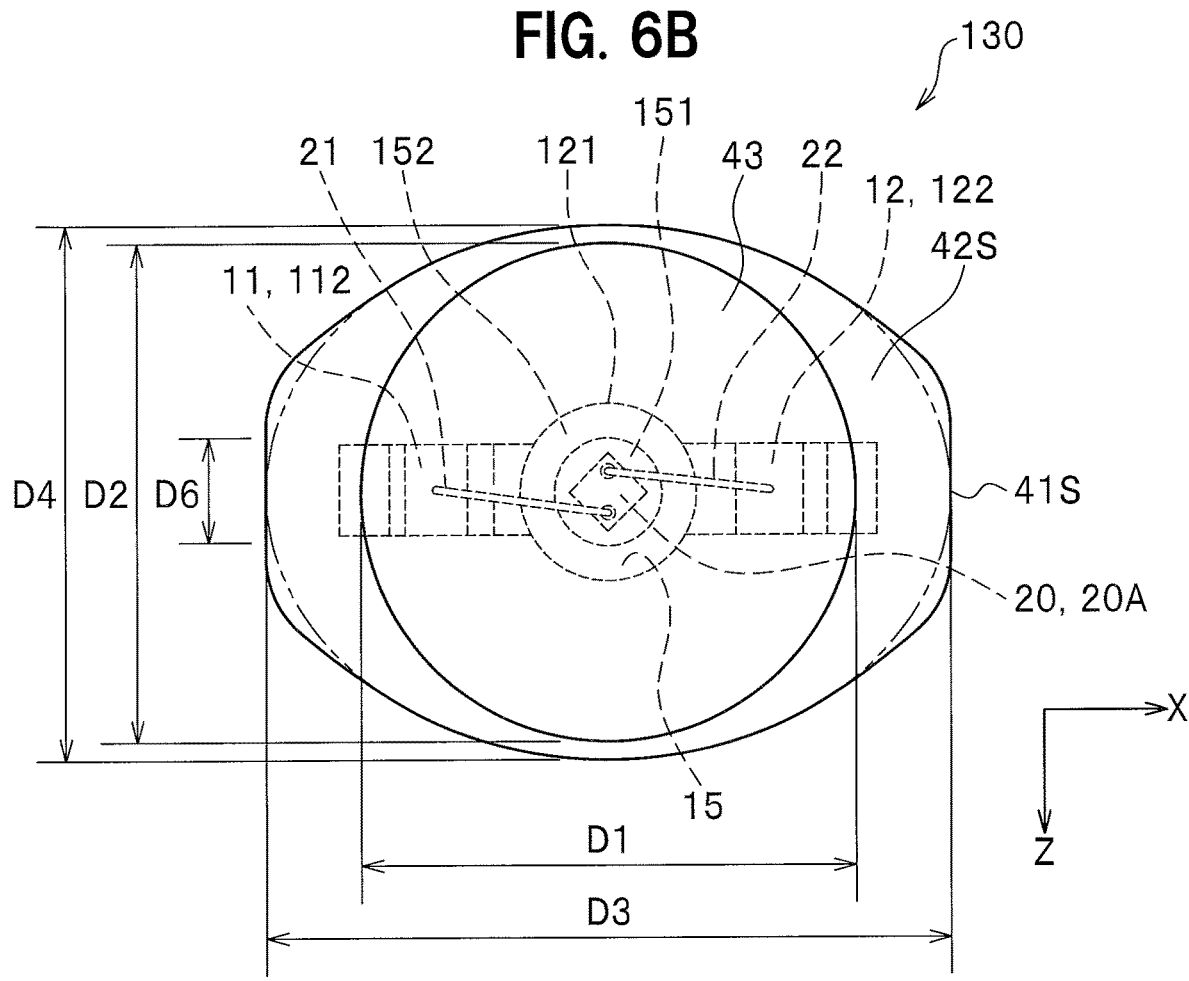

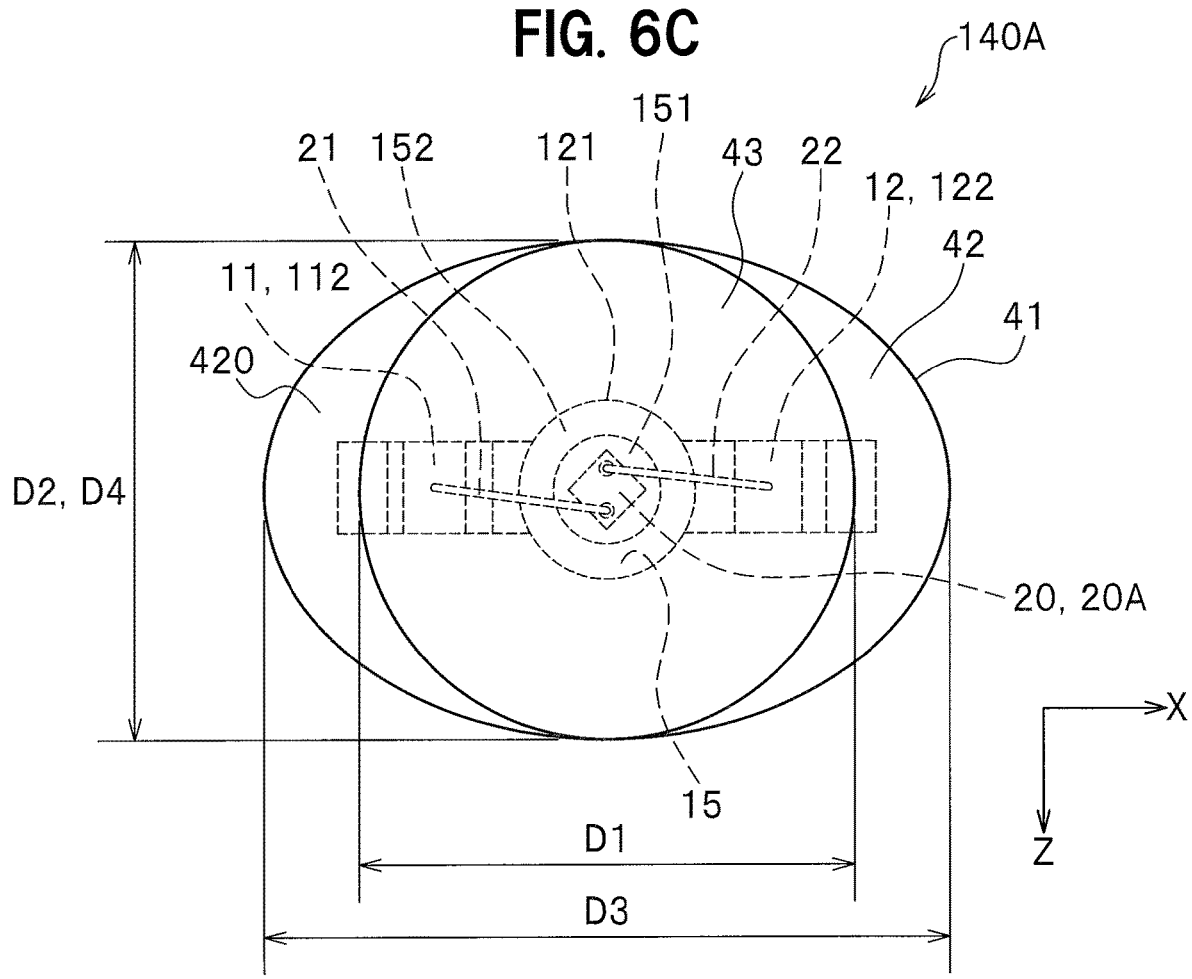

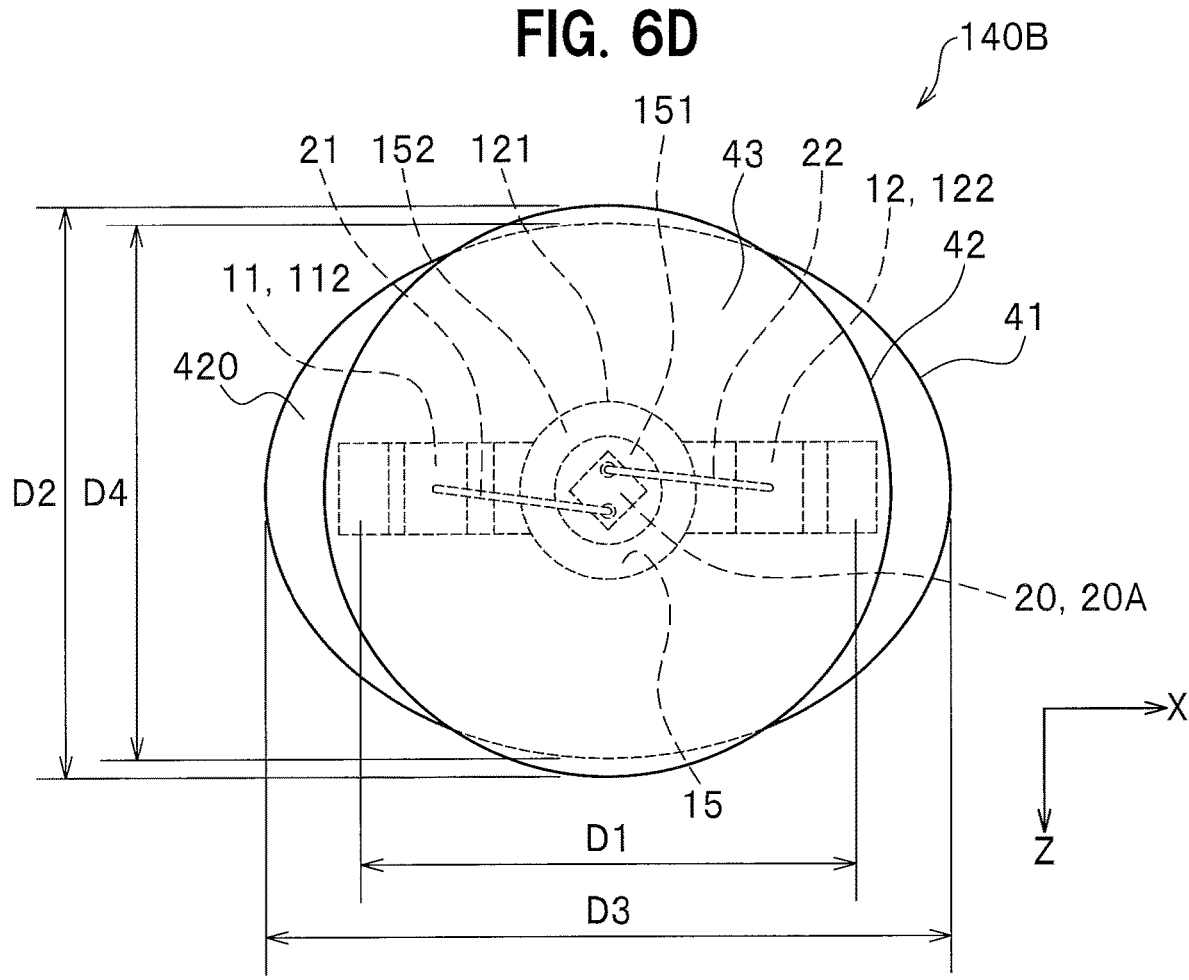

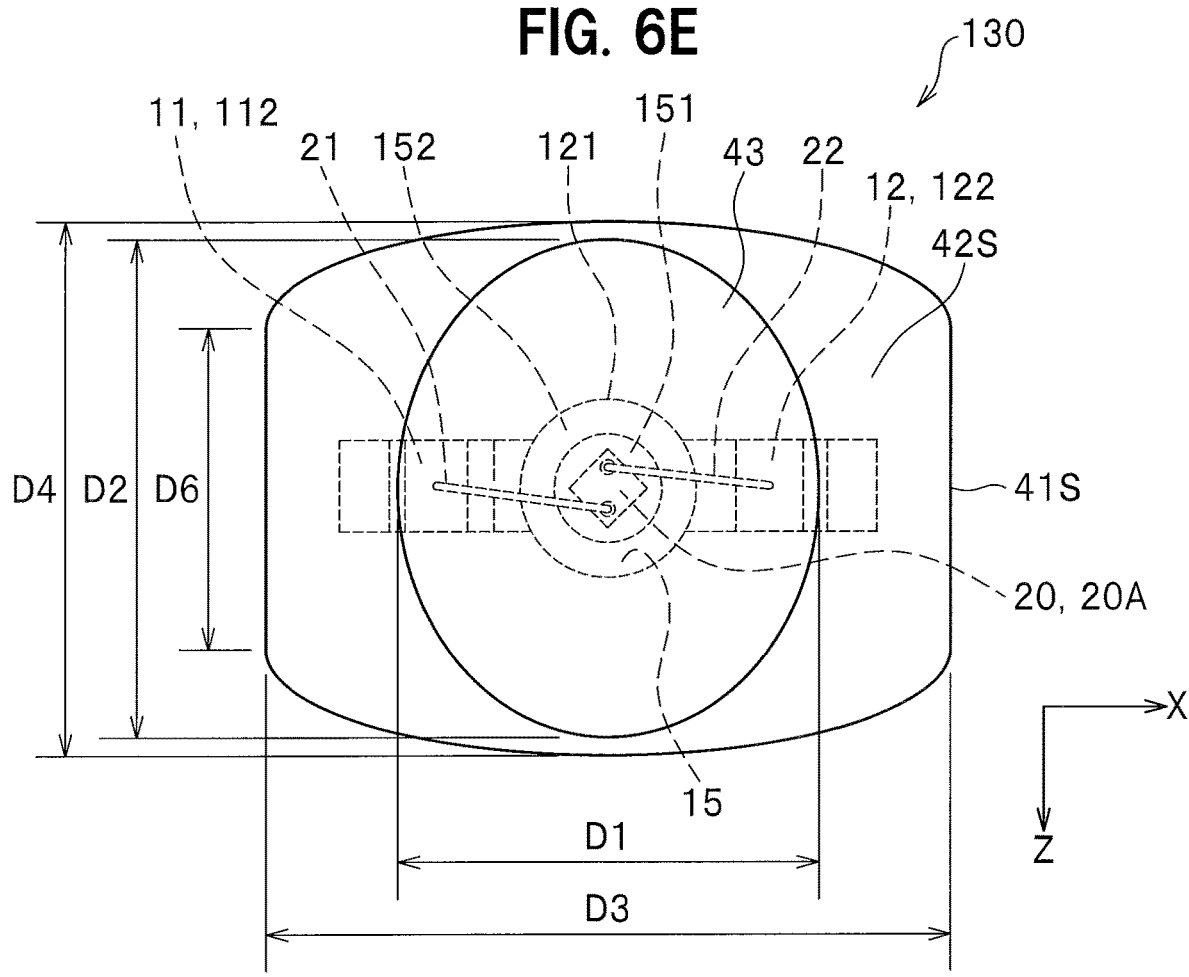

LIGHT-EMITTING DEVICE, LIGHT SOURCE DEVICE, AND METHOD FOR MANUFACTURING LIGHT-EMITTING DEVICE

CROSS-REFERENCE TO RELATED APPLICATION

This application claims priority to Japanese Patent Application No. 2021-186697, filed on Nov. 16, 2021, and Japanese Patent Application No. 2022-173751, filed on Oct. 28, 2022, the disclosures of which are hereby incorporated by reference in their entirety.

BACKGROUND OF THE INVENTION

Field of the Invention

The present disclosure relates to a light-emitting device, a light source device, and a method for manufacturing the light-emitting device.

Discussion of the Background

An oval light-emitting device is known as a light-emitting device. For example, Japanese Patent Publication No. 2010-040910 describes an LED module in which a curvature of an emitting surface in a zx plane is less than a curvature in a yz plane. Further, for example, Japanese Patent Publication No. 2002-094129 describes an optical device in which a part of light emitted from a light-emitting element is totally reflected in a total reflective region, then is reflected by a light reflective portion, and is emitted forward from the total reflective region.

SUMMARY

An embodiment according to the present disclosure provides a light-emitting device and a light source device having narrowed light distribution, and a method for manufacturing the light-emitting device.

A light-emitting device disclosed in an embodiment includes: a light-emitting element, a first lead, a second lead, and a mold resin member. The light-emitting element is mounted on the first lead. The second lead is electrically connected to the light-emitting element via a conductive member, and disposed away from the first lead along a first direction. The mold resin member directly or indirectly covers the light-emitting element. The mold resin member includes a lens portion located above the light-emitting element, a fixing portion configured to fix the first lead and the second lead, and an inclined portion. The inclined portion is located between the lens portion and the fixing portion, and the inclined portion has at least a portion spreading and inclined from a boundary between the inclined portion and the lens portion toward a boundary between the inclined portion and the fixing portion. The light-emitting element is disposed inside the fixing portion.

A method for manufacturing a light-emitting device disclosed in an embodiment includes: providing an intermediate body in which light-emitting elements mounted on first leads of linked bodies, the linked bodies comprising one or more pairs of the first lead and a second lead with a linked portion, and the light-emitting element and the second lead are electrically connected via a conductive member in the one or more pairs; supplying a material of a mold resin member in recesses in a casting case; inserting the intermediate body into the recesses in which the material of the mold resin member is supplied, and forming the mold resin member configured to directly or indirectly cover the light-emitting elements for each pair of the first lead and the second lead; and individually separating by cutting off the linked portion of the linked body so as to make the pairs each comprising the first lead and the second lead. In the supplying of the material of the mold resin member in the recess, the casting case has a lens portion opening on a bottom side of the casting case, an inclined portion opening connected from the lens portion opening and spreading and inclined toward an opening side of the casting case, and a fixing portion opening connected from the inclined portion opening toward the opening side of the casting case. In the forming of the mold resin member, the light-emitting element is disposed inside the fixing portion opening.

A light source device disclosed in an embodiment includes: a plurality of light-emitting devices; and a mounting substrate on which the plurality of light-emitting devices are mounted. The plurality of light-emitting devices are each the above-described light-emitting device. The inclined portion of at least one of the plurality of light-emitting devices is disposed with the lens portion interposed therein in the first direction. The plurality of light-emitting devices are disposed in a direction parallel to the first direction.

An embodiment of the present disclosure can provide a light-emitting device and a light source device having narrowed light distribution, and a method for manufacturing the light-emitting device.

BRIEF DESCRIPTION OF DRAWINGS

FIG. 3C is a schematic plan view exemplifying a part of the light-emitting device according to the embodiment.

FIG. 6B is a schematic plan view exemplifying the modification example of the fixing portion.

FIG. 6C is a schematic plan view illustrating a modification example of a lens portion and the fixing portion in a second direction.

FIG. 6D is a schematic plan view illustrating a modification example of the lens portion and the fixing portion in the second direction.

FIG. 6E is a schematic plan view illustrating a modification example of the lens portion and the fixing portion in the second direction.

DESCRIPTION OF EMBODIMENTS

Figure 1:
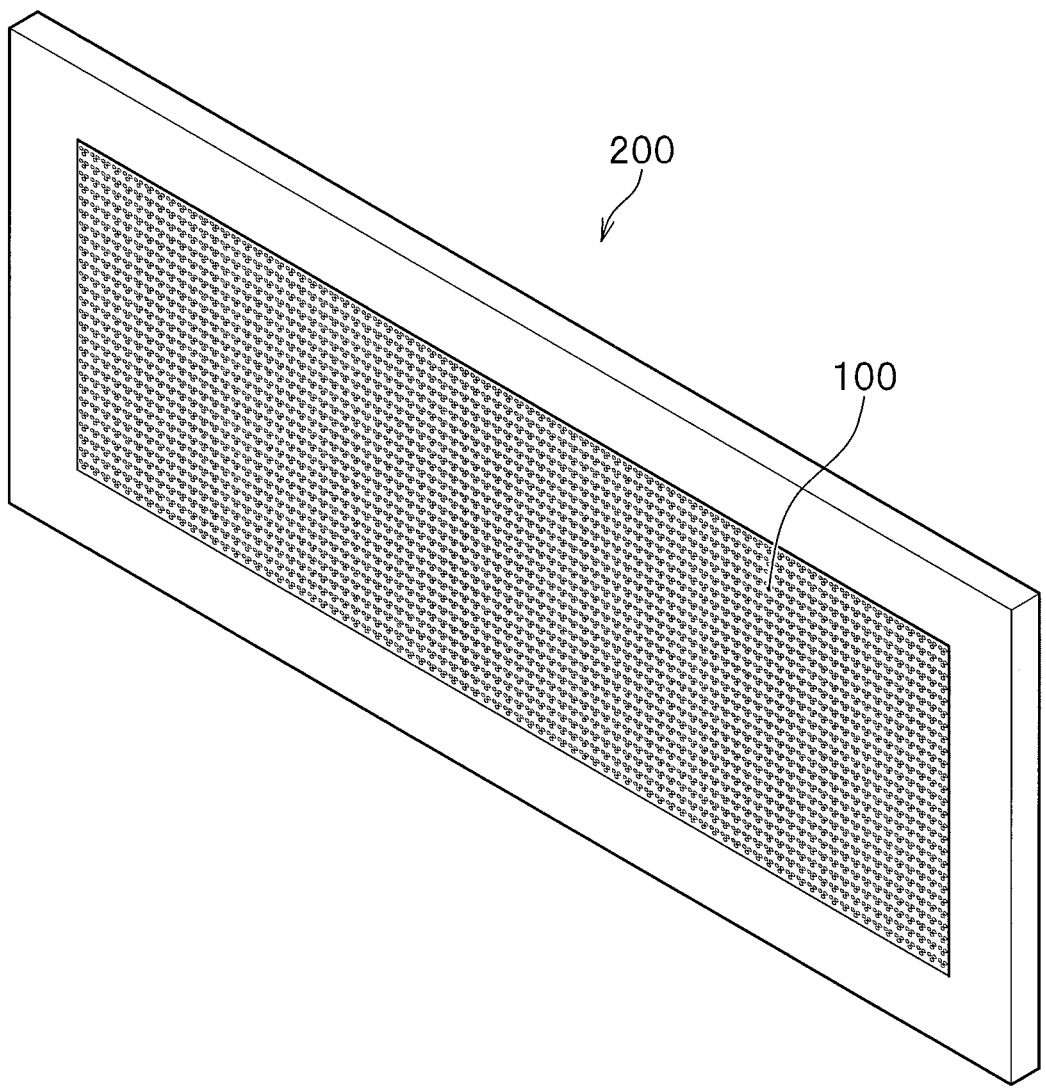
FIG. 1 is a schematic perspective view exemplifying a light source device in which light-emitting devices according to an embodiment are arrayed.

Embodiments will be described below with reference to the drawings. However, the embodiments described below are an example of a light-emitting device, light source device and a method for manufacturing the light-emitting device for embodying a technical idea according to the present disclosure, and are not limited to the following. Further, dimensions, materials, shapes, relative arrangements, or the like of components described in the embodiment are not intended to limit the scope of the present invention thereto, unless otherwise specified, and are merely exemplary. Note that, size, positional relationship, and the like of members illustrated in the drawings can be exaggerated or simplified for clarity of description. Further, in the embodiments, "cover" implies not only a case with direct contact, but also implies a case with indirect contact, that is, covering with other members between, for example. Further, an X direction refers to a direction along an X axis, a Y direction refers to a direction along a Y axis, and a Z direction refers to a direction along a Z-axis direction. A positive direction particularly refers to a direction toward a + side in each of the X, Y, and Z directions. A negative direction particularly refers to a direction toward a – side in each of the X, Y, and Z directions. A plane including the X direction and the Z direction is referred to as an XZ plane, a plane including the X direction and the Y direction is referred to as an XY plane, and a plane including the Y direction and the Z direction is referred to as a YZ plane.

Light-Emitting Device

Figure 2A:
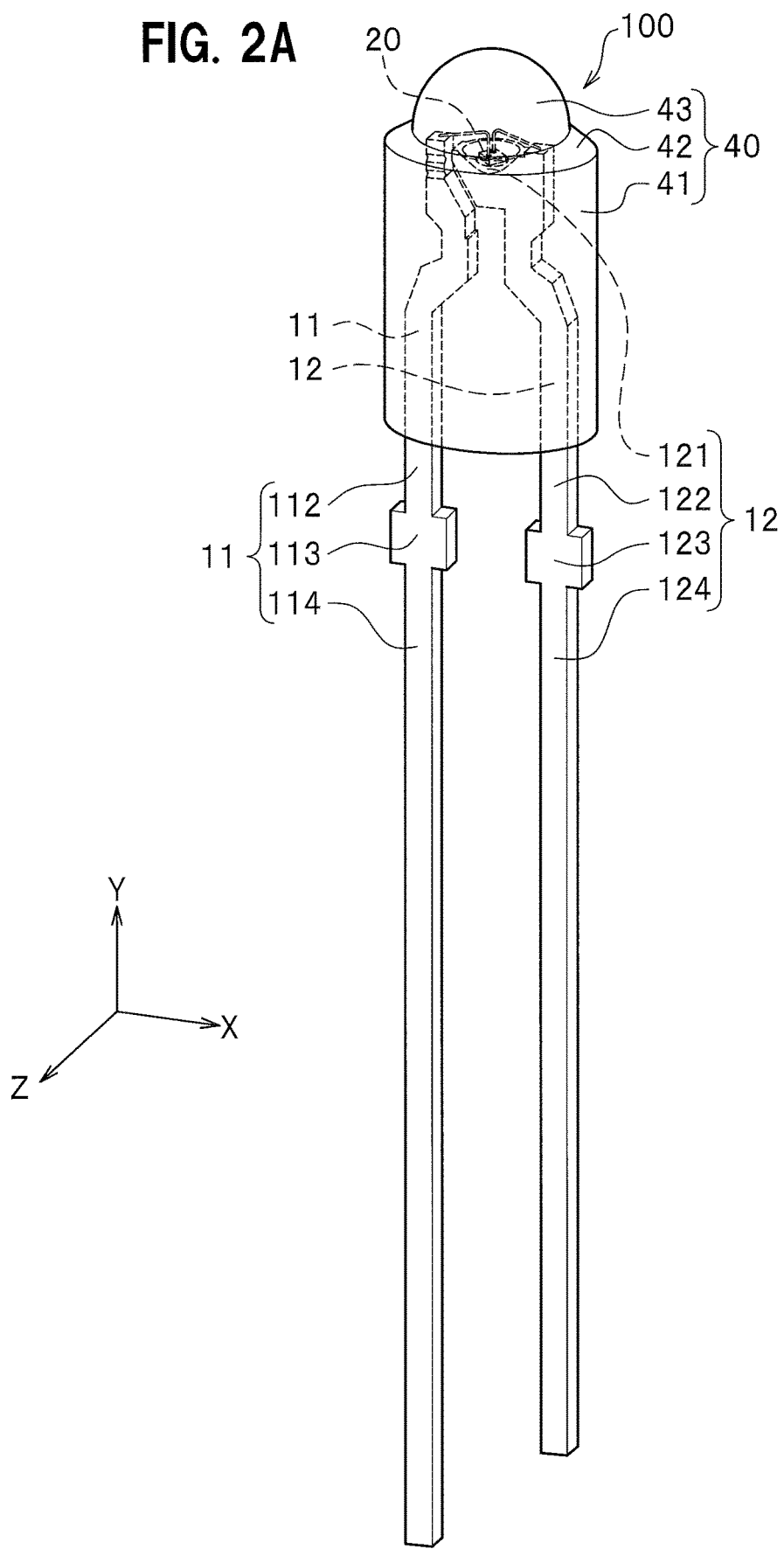
FIG. 2A is a schematic perspective view exemplifying a light-emitting device according to the embodiment.
Figure 2B:
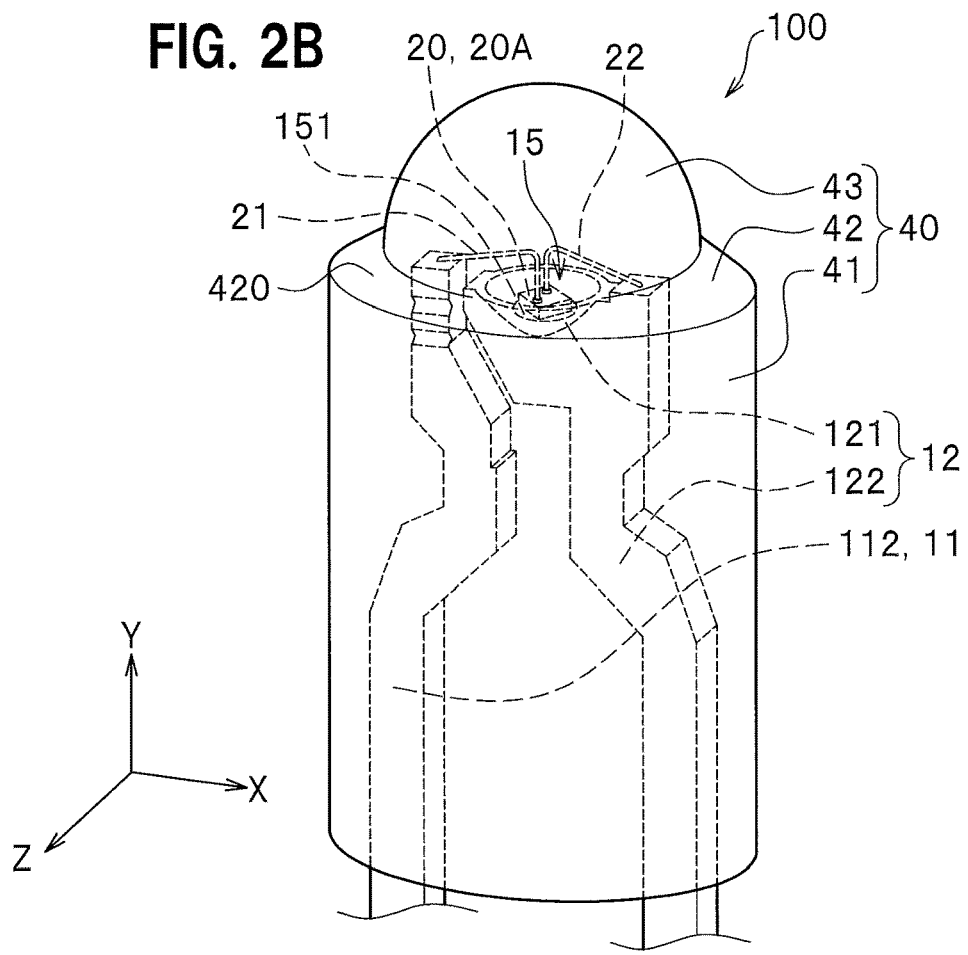
FIG. 2B is a schematic perspective view exemplifying a part of the light-emitting device according to the embodiment.
Figure 2C:
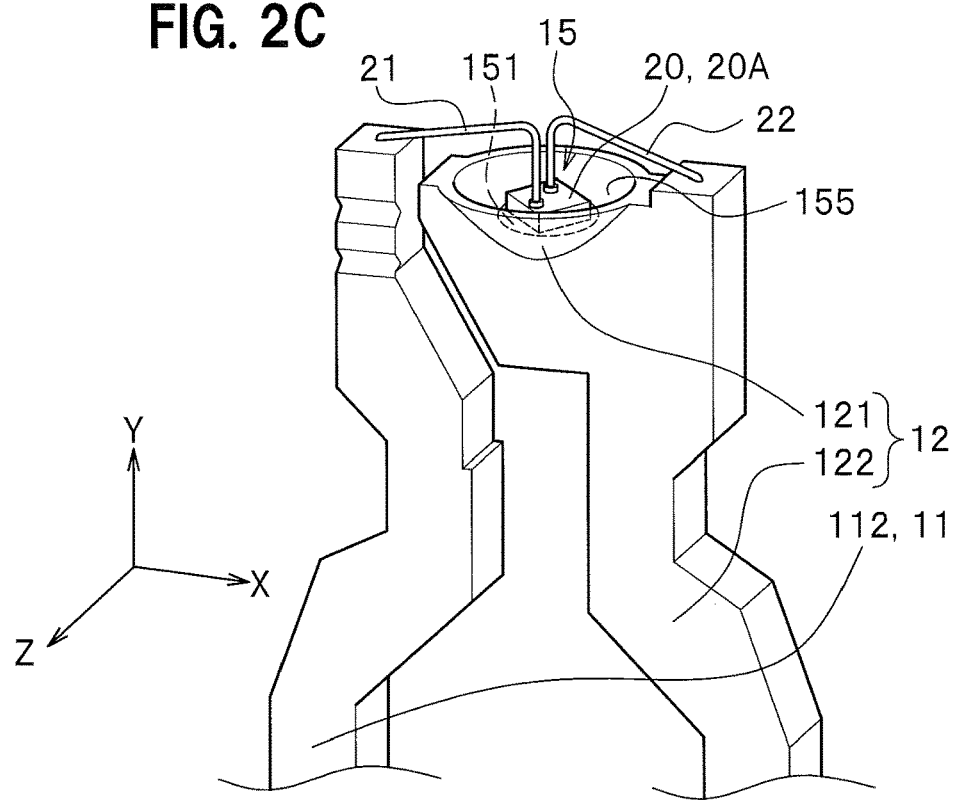
FIG. 2C is a schematic perspective view illustrating an enlarged part of FIG. 2B except for a mold resin member.
Figure 3A:
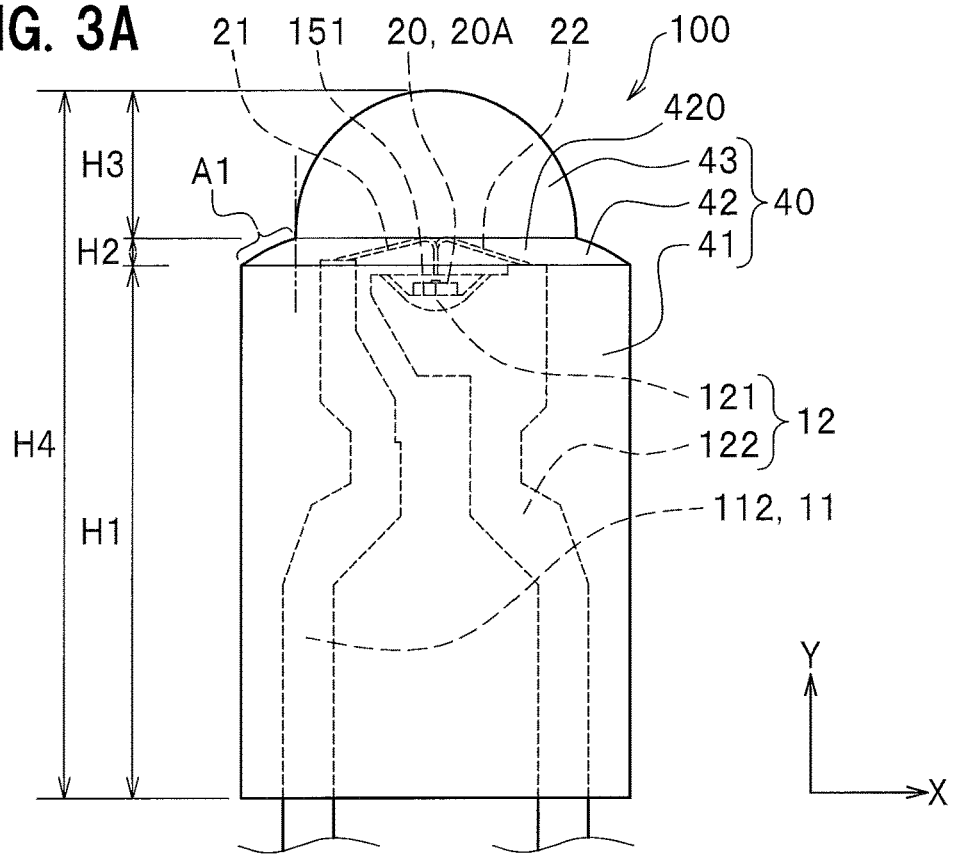
FIG. 3A is a schematic lateral side view exemplifying a part of the light-emitting device according to the embodiment.
Figure 3B:
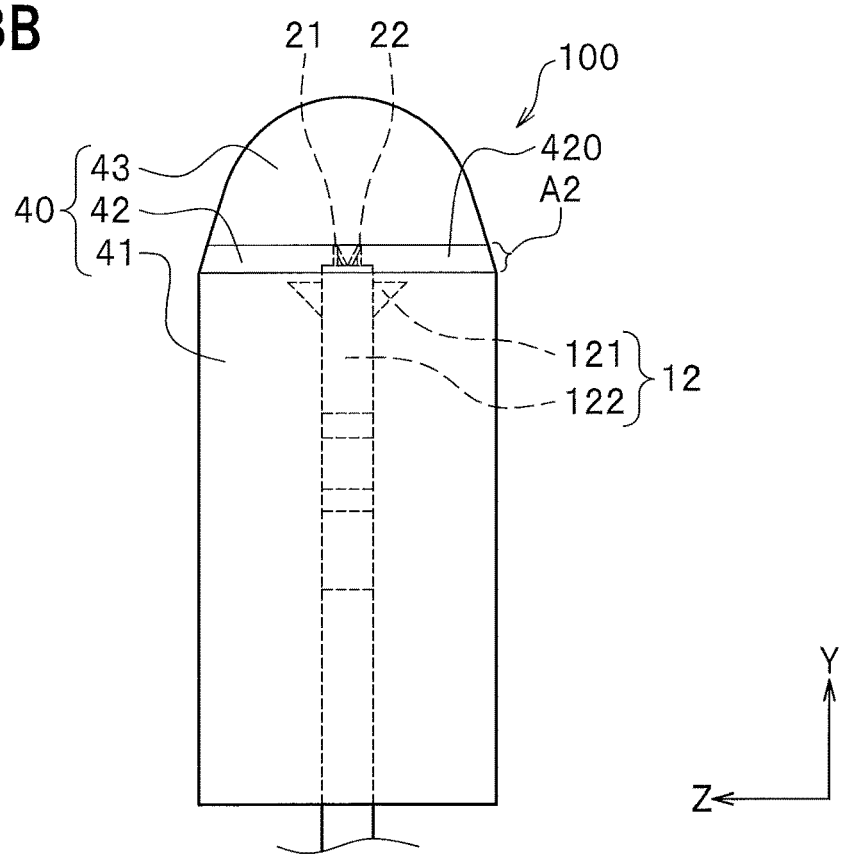
FIG. 3B is a schematic lateral side view exemplifying a part of the light-emitting device according to the embodiment.
Figure 4A:
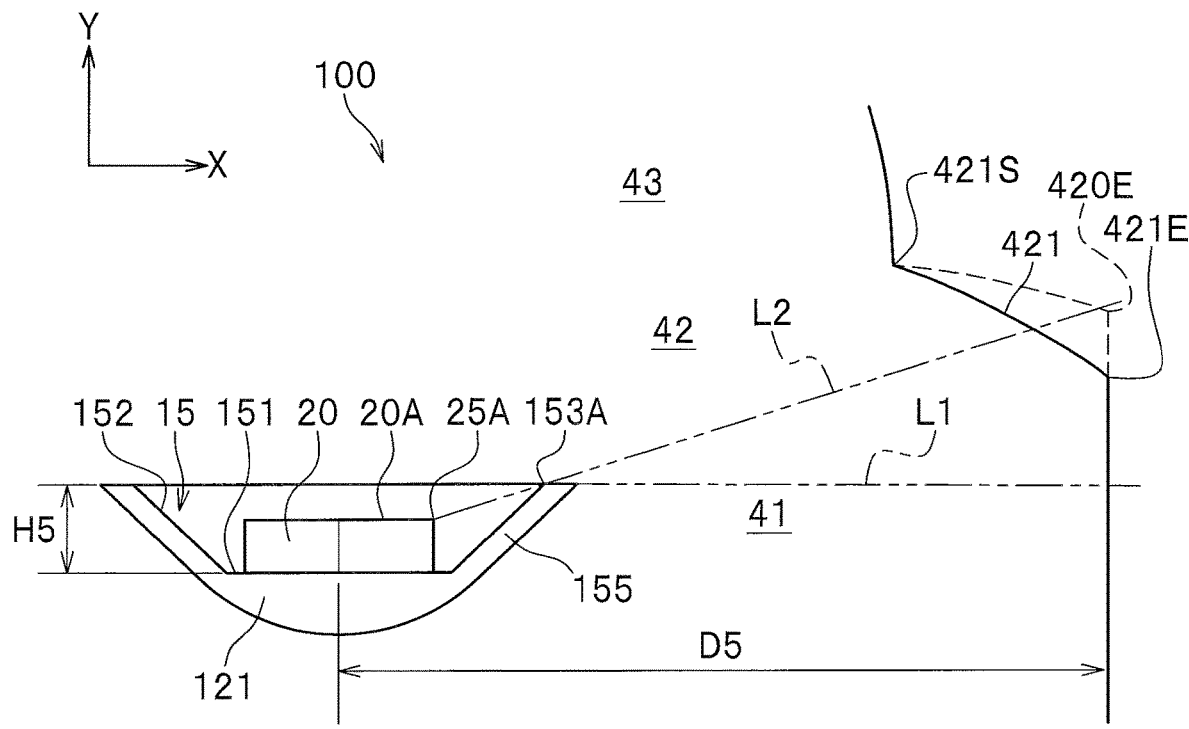
FIG. 4A is a schematic cross-sectional view exemplifying a part of a cross section taken along a line IVA-IVA in FIG. 3C except for a first lead, a second lead, and a conductive member.
Figure 4B:
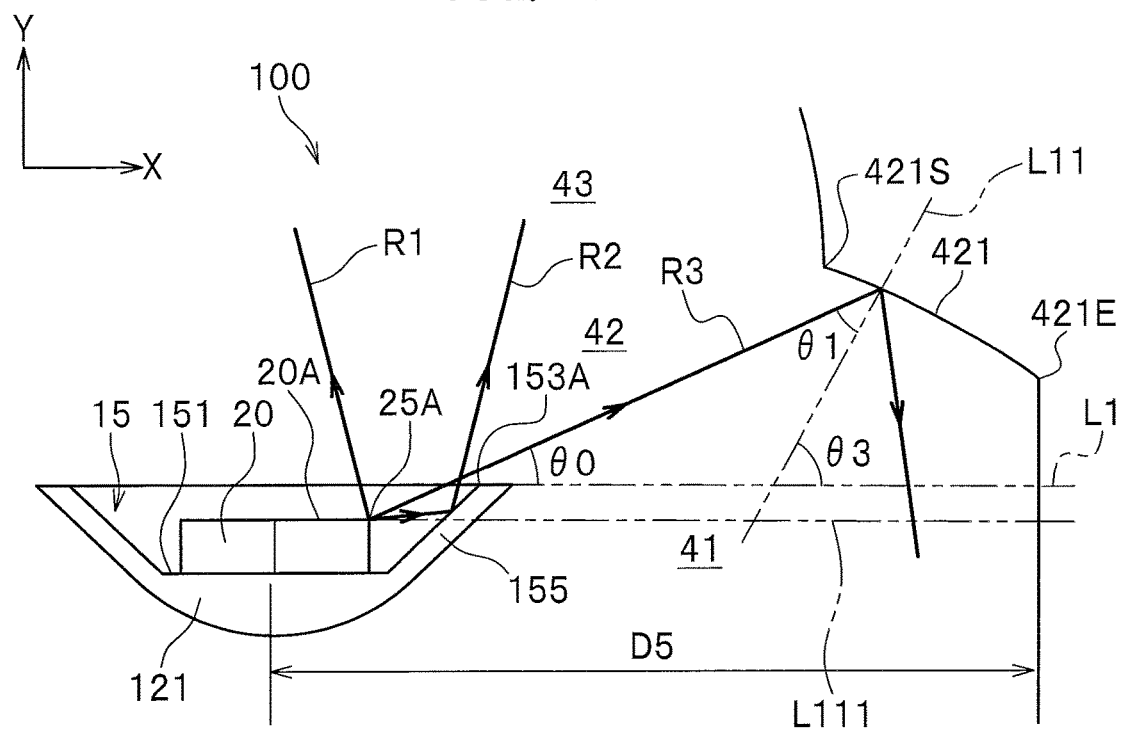
FIG. 4B is a schematic cross-sectional view exemplifying light from a light-emitting element in FIG. 4A.

A light-emitting device 100 according to an embodiment will be described with reference to FIGS. 1 to 4B. FIG. 1 is a schematic perspective view exemplifying a light source device 200 in which the light-emitting devices 100 are arrayed. FIG. 2A is a schematic perspective view exemplifying the light-emitting device 100. FIG. 2B is a schematic perspective view exemplifying a part of the light-emitting device 100. FIG. 2C is a schematic perspective view illustrating an enlarged part of FIG. 2B except for a mold resin member 40. FIG. 3A is a schematic lateral side view exemplifying a part of the light-emitting device 100. FIG. 3B is a schematic lateral side view exemplifying a part of the light-emitting device 100. FIG. 3C is a schematic plan view exemplifying a part of the light-emitting device 100. FIGS. 4A and 4B are schematic cross-sectional views exemplifying a part of a cross section taken along a line IVA-IVA in FIG. 3C except for a first lead 12, a second lead 11, and conductive members 21 and 22, and do not illustrate hatching.

The light-emitting device 100 can be used in, for example, the light source device 200 described below. The light source device 200 is a device in which a plurality of the light-emitting devices 100 are aligned on a plane. Each of the configurations of the light-emitting device 100 will be described below.

The light-emitting device 100 includes a light-emitting element 20, the first lead 12 on which the light-emitting element 20 is mounted, the second lead 11 that is electrically connected to the light-emitting element 20 via the conductive member 21 and is disposed away from the first lead 12 along the X direction being a first direction, and the mold resin member 40 that directly or indirectly covers the light-emitting element 20. The mold resin member 40 includes a lens portion 43 located above the light-emitting element 20, a fixing portion 41 that fixes the first lead 12 and the second lead 11, and an inclined portion 42 that is located between the lens portion 43 and the fixing portion 41 and having at least a portion spreading and inclined from a boundary with the lens portion 43 toward a boundary with the fixing portion 41. The light-emitting element 20 is disposed inside the fixing portion 41. Note that, in the drawings, the first direction being a direction that connects the first lead 12 and the second lead 11 indicates the X direction, a second direction orthogonal to the X direction being the first direction indicates the Z direction, and a third direction that is orthogonal to the X direction being the first direction and the Z direction being the second direction and is a direction in which the first lead 12 and the second lead 11 extend indicates the Y direction. The Y direction being the third direction may be described as an up-and-down direction. "An upward direction" referred in the present disclosure is indicated as a positive Y direction in the drawings.

First Lead and Second Lead

The first lead 12 and the second lead 11 serve as a part of a wiring between the light-emitting element 20 and the outside. The light-emitting element 20 is mounted on the first lead 12. The second lead 11 is electrically connected to the light-emitting element 20 via the conductive member 21, and is disposed away from the first lead 12 along the X direction. The first lead 12 is, for example, a cathode electrode, and the second lead 11 is, for example, an anode electrode. Note that, as an example, the second lead 11 is formed longer in the Y direction than the first lead 12. The first lead 12 can be formed longer in the Y direction than the second lead 11. In the light-emitting device 100, the first lead 12 includes a cup portion 121 described below. The light-emitting element 20 is mounted on the cup portion 121. The first lead 12 and the second lead 11 extend downward from above the fixing portion 41 of the mold resin member 40 described below. Then, a part of the first lead 12 and the second lead 11 protrudes from a lower surface of the fixing portion 41 and have a predetermined length exposed from the fixing portion 41. The first lead 12 and the second lead 11 include connection end portions 114 and 124 exposed from the mold resin member 40, respectively. In the first lead 12 and the second lead 11, silver can be plated from a perspective of an effective use of light reflection. From a perspective of suppressing migration of silver, a lead on which the light-emitting element 20 is mounted is preferably used as a cathode electrode.

The first lead 12 includes the cup portion 121, a first bottom portion 122 continuous with the cup portion 121, a first linked portion 123 continuous with the first bottom portion 122, and the first connection end portion 124 continuous with the first linked portion 123. The cup portion 121 and the first bottom portion 122 are continuous in at least the Y direction or the X direction. The first bottom portion 122, the first linked portion 123, and the first connection end portion 124 are located in this order from the positive Y direction toward a negative Y direction. For example, an upper end of the first bottom portion 122 can be located above the cup portion 121. Further, the upper end of the first bottom portion 122 and an upper edge of the cup portion 121 can have the same height. Furthermore, the upper end of the first bottom portion 122 can be located below the upper edge of the cup portion 121.

The cup portion 121 includes a recessed portion 15 defined by a bottom flat surface 151 facing upward and a lateral wall 155 surrounding the bottom flat surface 151. The light-emitting element 20 is mounted on the bottom flat surface 151 of the recessed portion 15. In the recessed portion 15, an inner surface 152 of the lateral wall 155 is inclined with an opening that spreads upward. For example, the opening of the recessed portion 15 is formed in a substantially circular shape or a substantially elliptical shape in a plan view. The plan view according to the present embodiment indicates a field of view when viewed from the positive Y direction.

The height from the bottom flat surface 151 of the recessed portion 15 to an upper end portion of the lateral wall 155 (a part of the upper edge of the cup portion), in a direction perpendicular to the bottom flat surface 151 of the recessed portion 15 is higher than a height of the light-emitting element 20. The height H5 is preferably in a range from 0.2 mm to 0.4 mm, for example. When the height H5 is equal to or more than 0.2 mm, the inner surface 152 of the recessed portion 15 reflects light emitted from the lateral sides of the light-emitting element 20, and thus light extraction upward from the light-emitting element 20 can be improved. On the other hand, when the height H5 is equal to or less than 0.4 mm, reflection of the light emitted from the light-emitting element 20 by the inner surface 152 of the recessed portion 15 for multiple times can be suppressed, and thus the light extraction upward from the light-emitting element 20 can be improved. From a perspective of providing the effect described above, the height H5 is more preferably in a range from 0.2 mm to 0.37 mm. Note that a light-transmissive member 30 described below can be disposed as a portion of the mold resin member 40 in the recessed portion 15.

The first bottom portion 122 is elongated in a long shape. Further, an upper portion of the first bottom portion 122 covered with the mold resin member 40 includes a stepped portion bent in a direction approaching the second lead 11. Further, the upper portion of the first bottom portion 122 is disposed adjacent to the cup portion 121. An upper end of the first bottom portion 122 is preferably formed flat such that another end of the conductive member 22 connected to the light-emitting element 20 can be connected. The first bottom portion 122 is provided with the stepped portion downward from an upper portion adjacent to the cup portion 121, and is continuous with a linear portion via the stepped portion. A lower end of the linear portion is disposed continuous with the first linked portion 123. The first linked portion 123 can be formed wide in the X direction. Then, the first connection end portion 124 having the same width and the same thickness as those of the lower end of the first bottom portion 122 is disposed at a lower end of the first linked portion 123. The first connection end portion 124 can be linearly formed in the Y direction.

The second lead 11 includes a second bottom portion 112, a second linked portion 113 continuous with the second bottom portion 112, and the second connection end portion 114 continuous with the second linked portion 113. An upper portion of the second bottom portion 112 is disposed apart from the first bottom portion 122 in the X direction so as not to be electrically shorted. Here, when viewed from the Z direction, a shape of the second bottom portion 112 and the first bottom portion 122 is a substantially bilaterally symmetric shape. An upper end of the second bottom portion 112 is preferably formed flat such that another end of the conductive member 21 connected to the light-emitting element 20 can be connected. An upper portion of the second bottom portion 112 being covered with the mold resin member 40 and facing the first bottom portion 122 includes a stepped portion bent in a direction approaching the first lead 12. A lower end side of the second bottom portion 112 is linearly formed, and is disposed continuous with the second linked portion 113. The second linked portion 113 can be formed wide in the X direction. Then, the second connection end portion 114 having the same width and the same thickness as those of a lower end of the second bottom portion 112 is disposed at a lower end of the second linked portion 113. The second connection end portion 114 can be linearly formed in the Y direction. The second connection end portion 114 can be formed longer than the first connection end portion 124. Note that the first linked portion 123 and the second linked portion 113 are disposed at the same height in the X direction. The first connection end portion 124 and the second connection end portion 114 are disposed in parallel.

Examples of a material of the first lead 12 and the second lead 11 include iron, copper, a copper-iron alloy, a copper-tin alloy, and aluminum, iron, copper, or a combination thereof that is subjected to copper plating, gold plating, or silver plating. For example, the cup portion 121 and the first bottom portion 122 of the first lead 12 and the second bottom portion 112 of the second lead 11 that are covered with the mold resin member 40 can be subjected to silver plating with copper plating as primary plating, and the first linked portion 123 and the first connection end portion 124 of the first lead 12, and the second linked portion 113 and the second connection end portion 114 of the second lead 11 can be subjected to tin plating, copper plating, silver plating, or solder plating containing tin and/or copper.

Note that the substantially elliptical shape described in the present embodiment is not limited to a case of an elliptical shape in a strict sense such as a locus of points in which a sum of distances from two fixed points on one plane is constant, and includes a shape so as to be visible as close to the elliptical shape. For example, the substantially elliptical shape can be an oblong shape in which a circle is extended in one direction, an oval shape, a track shape for a track and field event, and the like.

Further, the substantially circular shape described in the present embodiment is not limited to a case of a circular shape in a strict sense such as a perfect circle, and includes a shape so as to be visible as close to the circular shape. For example, the substantially circular shape can be a circle distorted or deformed within a range of tolerance and error.

Light-Emitting Element

The light-emitting element 20 is mounted on the bottom flat surface 151 of the recessed portion 15. Discretionary shape, size, and the like can be selected for the light-emitting element 20. A shape of the light-emitting element 20 in the plan view is, for example, a square, a rectangle, or a hexagon. In terms of the color of the light emitted from the light-emitting element 20, light with discretionary wavelength appropriate for application can be selected. For example, examples of the light-emitting element 20 of blue light (light having a peak wavelength in a range from 430 nm to 500 nm) or green light (light having a peak wavelength in a range from 500 nm to 570 nm) include those using a nitride-based semiconductor ($In_XAl_YGa_{1-X-Y}N$, $0 \leq X$, $0 \leq Y$, $X+Y \leq 1$), GaP, and the like. Examples of the light-emitting element 20 of red light (light having a peak wavelength in a range from 610 nm to 700 nm) include those using not only a nitride-based semiconductor element but also GaAlAs, AlInGaP, and the like. The height of the light-emitting element 20 is in a range from 0.15 mm to 0.5 mm, for example.

The light-emitting element 20 can include a pair of element electrodes on an upper surface 20A, and can be face-up mounted on the bottom flat surface 151 of the recessed portion 15 of the first lead 12. Here, one of the element electrodes of the light-emitting element 20 is bonded to the second lead 11 via the conductive member 21 such as a wire, and the other element electrode is bonded to the first lead 12 via the conductive member 22 such as a wire. The light-emitting element 20 can be face-down mounted.

Here, the light-emitting element 20 is disposed in the fixing portion 41 of the mold resin member 40. Further, the light-emitting element 20 is disposed in a substantially center position of the fixing portion 41 and the lens portion 43 described below in the plan view. The substantially center position is not limited to the center in a strict sense, and includes a position so as to be visible as close to the center. For example, the substantially center position can be a position shifted from the center by 10% of a maximum diameter.

Mold Resin Member

The mold resin member 40 covers the first lead 12 and the second lead 11 while exposing the connection end portions 124 and 114, and directly or indirectly covers the light-emitting element 20. The mold resin member 40 is preferably formed solid. In a cross section of the light-emitting device 100, the mold resin member 40 preferably fills from an outer surface of the first lead 12 and the second lead 11 to an inner surface of the mold resin member 40. Note that a void can be included in a part of the mold resin member 40. The mold resin member 40 protects the first lead 12, the second lead 11, the light-emitting element 20, and the conductive members 21 and 22 such as the wire from an external environment, and fixes one end side of the first lead 12 and the second lead 11. Further, the light-emitting device 100 can adjust a light distribution by adjusting a shape of the mold resin member 40.

The mold resin member 40 includes the lens portion 43, the inclined portion 42, and the fixing portion 41 in this order from up to down in the Y direction. Here, the lens portion 43, the inclined portion 42, and the fixing portion 41 of the mold resin member 40 are continuously and integrally formed. For example, the lens portion 43 and the inclined portion 42 can be integrally formed, and the fixing portion 41 can be separately formed.

Fixing Portion

The fixing portion 41 is a portion located in a lowermost position in the mold resin member 40. The light-emitting element 20 is covered near an upper end portion of the fixing portion 41. An upper edge of the fixing portion 41 is located at the same height as the upper end portion of the recessed portion 15 or located above the upper end portion of the recessed portion 15. The upper edge of the fixing portion 41 is located at the same height as the upper edge of the lateral wall of the recessed portion or located above the upper edge of the lateral wall of the recessed portion. Further, the fixing portion 41 preferably covers substantially the entire first bottom portion 122 of the first lead 12 and substantially the entire second bottom portion 112 of the second lead 11, and expose the first linked portion 123 and the second linked portion 113.

Here, the fixing portion 41 has a columnar shape extending in the Y direction, and the fixing portion 41 has the substantially elliptical shape with the X direction as a major axis in the plan view. A ratio of lengths of a long diameter and a short diameter of the substantially elliptical shape is, for example, approximately 1.3:1.

In the plan view, a length D3 of the fixing portion 41 in the X direction being the first direction can be in a range from 3.4 mm to 4.4 mm, for example, and preferably in a range from 3.6 mm to 4.2 mm. Further, in the plan view, a length D4 of the fixing portion 41 in the Z direction being the second direction can be in a range from 2.5 mm to 3.5 mm, for example, and preferably in a range from 2.7 mm to 3.3 mm.

A longest length H4 of the mold resin member 40 in the Y direction being the third direction can be in a range from 5.5 mm to 9.5 mm, for example, and preferably in a range from 6.5 mm to 8.2 mm.

Lens Portion

The lens portion 43 is located in an uppermost position in the mold resin member 40. The lens portion 43 is located above the light-emitting element 20. The lens portion 43 is preferably located above the upper surface 20A of the light-emitting element 20. A part of light from the light-emitting element 20 is emitted to the outside of the light-emitting device 100 through the lens portion 43. The lens portion 43 includes a curved surface protruding upward, and has, for example, a hemispherical shape protruding upward. The lens portion 43 can condense and output light from the light-emitting element 20 upward.

As an example, the lens portion 43 has the substantially elliptical shape close to the circular shape with the X direction as the major axis in the plan view. Here, in the light-emitting device 100, both of the lens portion 43 and the fixing portion 41 have the elliptical shape in the plan view.

A longest length H3 of the lens portion 43 in the Y direction being the third direction can be in a range from 0.5 mm to 3.5 mm, for example, and preferably in a range from 0.8 mm to 2.5 mm.

Here, in the plan view, the long diameter of the lens portion 43 is shorter than the long diameter of the fixing portion 41, and the short diameter of the lens portion 43 is shorter than the short diameter of the fixing portion 41. In other words, in the plan view, a length D1 of the lens portion 43 is shorter than the length D3 of the fixing portion 41 in the X direction, and a length D2 of the lens portion 43 is shorter than the length D4 of the fixing portion 41 in the Z direction. As shown in FIG. 3C, for example, the length D1 of the lens portion 43 in the X direction is in a range from 2.3 mm to 3.3 mm, and the length D2 of the lens portion 43 in the Z direction is in a range from 2.3 mm to 3.3 mm. A ratio of the length of the short diameter with respect to the long diameter of the lens portion 43 is greater than that of the fixing portion 41, and the lens portion 43 has a shape closer to the substantially circular shape in the plan view.

In the plan view, an outer periphery of the fixing portion 41 is greater than an outer periphery of the lens portion 43. In the plan view, the entire outer periphery of the lens portion 43 is located inside the outer periphery of the fixing portion 41. Further, in the plan view, the center of the outer periphery of the lens portion 43 substantially overlaps the center of the outer periphery of the fixing portion 41. The outer periphery of the fixing portion 41 is, for example, the upper edge of the fixing portion 41 located at a boundary with the inclined portion 42. The outer periphery of the lens portion 43 is, for example, a lower edge of the lens portion 43 located at the boundary with the inclined portion 42.

Inclined Portion

The inclined portion 42 is located between the lens portion 43 and the fixing portion 41. The inclined portion 42 spreads from the lower edge of the lens portion 43 toward the fixing portion 41. The inclined portion 42 is formed continuous with a surface of the lens portion 43 and a surface of the fixing portion 41. Further, the lower edge of the lens portion 43 being the boundary between the inclined portion 42 and the lens portion 43, and the upper edge of the fixing portion 41 being the boundary between the inclined portion 42 and the fixing portion 41 have different shapes or sizes. The inclined portion 42 is located above the upper edge of the lateral wall 155 of the recessed portion 15. The boundary between the fixing portion 41 and the inclined portion 42 may or may not overlap the upper end portion of the lateral wall 155 of the recessed portion 15 when viewed from the X direction being the first direction or the Z direction the second direction.

The inclined portion 42 includes an inclined surface 420 that is a surface of the inclined portion 42 and is inclined with respect to the XZ plane. In the cross-sectional view, the inclined surface 420 may be or may not be curved.

As shown in FIG. 3C, the inclined surface 420 is located on a straight line that at least passes through a vertex of the lens portion 43 and is parallel to the X direction being the first direction. The inclined surface 420 can be located on a straight line that passes through a vertex of the lens portion 43 and is parallel to the Z direction being the second direction. The inclined surface 420 can be a straight line or curved line.

An inclination length is a length from an upper end to a lower end of the inclined surface 420 of the inclined portion 42 (from a connection point of the inclined portion 42 to the lens portion 43 to a connection point to the fixing portion 41) in a cross section along the Y direction and the X direction or the Z direction. Here, a surface including a vertex of the lens portion 43 is described as an example. In the cross section along the XY plane, the inclined portion 42 has an inclination length A1. In the cross section along the YZ plane, the inclined portion 42 has an inclination length A2. The inclination length A1 is the same as the inclination length A2 or longer than the inclination length A2. Here, the inclination length A1 is longer than the inclination length A2.

Further, the inclined portion 42 has as an inclination angle that is an angle formed between a straight line connecting from the upper end to the lower end of the inclined surface 420 of the inclined portion 42, and a straight line parallel to the Y direction passing through the connection point of the inclined portion 42 connected to the lens portion 43. Here, the surface including the vertex of the lens portion 43 is described as an example. The inclination angle in the cross section along the XY plane is greater than the inclination angle in the cross section along the YZ plane. The inclined portion 42 has a reversed size relationship between the inclination angle described above and the angle formed between the straight line connecting from the upper end to the lower end of the inclined surface 420 of the inclined portion 42, and a straight line parallel to the X direction or the Z direction passing through the connection point of the inclined portion 42 to the fixing portion 41. An inclined cross-sectional area of the inclined portion 42 in the X direction is greater than an inclined cross-sectional area of the inclined portion 42 in the Z direction. Here, the inclined cross-sectional area refers to an area defined by three line segments in the YZ plane or YX plane including the vertex of the lens portion 43 described below. The three line segments are (i) a straight line being in parallel to the Y direction and passing through the connection point to the inclined portion 42, (ii) a straight line or a curved line connecting the connection portion of the lens portion 43 to a connection point to the fixing portion 41, and (iii) a straight line that is in parallel to the X direction or the Y direction and passes through a connection point of the inclined portion 42 to the fixing portion 41. As shown in the lateral side view in FIG. 3A, the inclined portion 420 is located at the left and right sides of the lens portion 43. Also as shown in the lateral side view in FIG. 3B, the inclined portion 420 is located at the left and light sides of the lens portion 43. In such a way, the light-emitting device 100 can set the directional characteristic in the X direction so as to be symmetric on both sides of the light-emitting device 100. Note that the inclined surface 420 of the inclined portion 42 surrounds the entire outer periphery of a lower end portion of the lens portion 43 here. The inclination of the inclination surface 420 in the X direction is more gentle than the inclination of the inclination surface 420 in the Z direction. The inclined surface 420 of the inclined portion 42 can be disposed such that its inclination is the same radially downward in the outer periphery of the lower end portion of the lens portion 43.

As illustrated in FIG. 4A, in the cross section taken along the X direction being the first direction and the Y direction being the third direction, a connection point 421E of the inclined portion 42 to the fixing portion 41 is located between a straight line L1 passing through the upper end portion of the lateral wall 155 of the recessed portion 15 and being parallel to the X direction, and a straight line L2 connecting an upper end portion 25A, which is an intersection point between the upper surface 20A and a lateral surface of the light-emitting element 20, and an upper end portion 153A of the lateral wall 155 of the recessed portion 15. The connection point of the inclined portion 42 to the fixing portion 41 can be located closer to the straight line L2, such as a connection point 420E illustrated in FIG. 4A, for example. The inclined surface 420 of the inclined portion 42 can be set to an angle at which light passing through the inclined portion 42 of the light emitted from the light-emitting element 20 travels in a direction parallel to the straight line L1, an angle at which the light travels below the straight line L1, or an angle at which the light can be totally reflected. The inclination can be set to the angle described above in the cross section along the X direction and the Y direction passing through the center of the lens portion 43 in the plan view.

Examples of a material of the mold resin member 40 include a transmissive resin, glass, and the like having good weather resistance, such as an epoxy resin, a urea resin, and silicone. The mold resin member 40 has transmissivity or a transparent body. The mold resin member 40 can contain a filler. The mold resin member 40 contains the filler, and thus a heat resistance of the molding resin can be improved. Examples of the filler include silicon oxide, and the like.

The mold resin member 40 can contain a coloring agent. For example, the mold resin member 40 contains a blue coloring agent, a green coloring agent, or a red coloring agent, and thus the light-emitting device 100 that emits blue light, the light-emitting device 100 that emits green light, and the light-emitting device 100 that emits red light can be achieved. By using the light-emitting devices 100, the light source device 200 that can perform display in full color can be manufactured.

For example, copper phthalocyanine, C.I. Pigment Green 36, and N,N'-dimethyl-3,4:9,10-perylenebisdicarbimide can be used as the coloring agent. Further, the coloring agent containing any one of a pigment and a dye can be used.

The pigment is not particularly limited, but there are pigments using, for example, an inorganic material and an organic material, and examples of the pigment include pigments using the following materials.

Examples of the inorganic material include colcothar ($Fe_2O_3$), minium ($Pb_3O_4$), titanium nickel antimony-based oxide, titanium nickel barium-based oxide, titanium chromium antimony-based oxide, titanium chromium niobium-based oxide, and the like.

Examples of the organic material include anthraquinone-based, azo-based, quinacridon-based, perylene-based, diketo-pyrrolo-pyrrole-based, monoazo-based, disazo-based, pyrazolone-based, benzimidazolone-based, quinoxaline-based, azomethine-based, isoindolinone-based, and isoindoline-based materials, and the like.

The dye is not particularly limited, but examples of the dye include anthraquinone-based dyes, methine-based dyes, azomethine-based dyes, oxazine-based dyes, azo-based dyes, styryl-based dyes, coumarin-based dyes, porphyrin-based dyes, dibenzofuranone-based dyes, diketo-pyroro-pyrrole-based dyes, rhodamine-based dyes, xanthene-based dyes, pyrromethene-based dyes, and the like.

Note that it is preferable that the pigment and the dye do not basically convert a wavelength of the light from the light-emitting element 20 into a different wavelength. The reason is that, when a wavelength conversion member is contained, the wavelength conversion member is not affected as described below.

The mold resin member 40 can contain a light stabilizer. Examples of the light stabilizer include benzotriazole-based, benzophenone-based, salicylate-based, cyanoacrylate-based, and hindered amine-based light stabilizers, and the like. The mold resin member 40 can contain a wavelength conversion member. Examples of the wavelength conversion member include a phosphor. Examples of the phosphor include yttrium aluminum garnet activated with cerium, lutetium aluminum garnet activated with cerium, terbium aluminum garnet activated with cerium, nitrogen-containing calcium aluminosilicate activated with one or both of europium and chromium, sialon activated with europium, silicate activated with europium, potassium silicate fluoride activated with manganese, a nitride phosphor activated with europium, a phosphor having a perovskite structure (for example, $CsPb(F,Cl,Br,I)_3$), a quantum dot phosphor (for example, CdSe, InP, $AgInS_2$, or $AgInSe_2$), or the like. Note that the light-emitting device 100 can emit light having various colors by a combination of the light-emitting element 20 and the wavelength conversion member.

Operation of Light-Emitting Device

When the light-emitting device 100 is driven, a current is supplied from an external power source to the light-emitting element 20 via the first lead 12 and the second lead 11, and the light-emitting element 20 emits light. Here, in the cross section taken along the X direction being the first direction and the Y direction being the third direction, traveling light of light emitted from the upper end portion 25A being the intersection point between the upper surface 20A and the lateral surface of the light-emitting element 20 is described as an example.

For example, light R1 emitted upward from the upper end portion 25A of the light-emitting element 20 travels to the lens portion 43. Light R2 laterally emitted from the upper end portion 25A is reflected by the lateral wall 155, changes a direction to an upper direction, and travels to the lens portion 43. The light traveling to the lens portion 43 is output to the outside of the light-emitting device 100 by the lens portion 43.

Light R3 traveling above the upper end portion 153A of the lateral wall 155 from the upper end portion 25A travels to an inclined surface 421 of the inclined portion 42 being an interface with the outside. The light R3 travels in a direction forming a traveling angle $\theta 0$ with the straight line L1, and is incident on the inclined surface 421 at an incident angle $\theta 1$. Note that a part of the light R3 is blocked by the lateral wall 155 of the recessed portion 15. Here, the traveling angle $\theta 0$ indicates an angle from a straight line L111 being parallel to the upper surface 20A of the light-emitting element 20 and passing through the upper end portion 25A. The straight line L111 and the straight line L1 are parallel to each other. Therefore, the traveling angle $\theta 0$ from the straight line L111 and the traveling angle $\theta 0$ from the straight line L1 are the same. Further, the incident angle $\theta 1$ is formed between a normal line L11 normal to the inclined portion 42 at a point at which the light R3 is incident on the inclined surface 421, and the light R3. Here, the inclined surface 421 of the inclined portion 42 is an angle at which the light from the light-emitting element 20 can be totally reflected, that is, an angle at which the incident angle $\theta 1$ is equal to or more than a critical angle, and thus the light R3 is totally reflected by the inclined surface 421, changes a direction to a lower direction, and travels in the direction. A waterproof member 70 described below is disposed below that absorbs the light, and can further suppress reflection.

The inclined surface 421 of the inclined portion 42 can have an angle at which the light can be totally reflected in the cross section along the X direction and the Y direction passing through the center of the lens portion 43 in the plan view. The cross section along the X direction and the Y direction passing through the center of the lens portion 43 includes a line connecting the vertex of the lens portion 43 and a center point of the lens portion 43 in the plan view.

The light-emitting device 100 totally reflects light at the inclined portion 42 adjacent to the lens portion 43, and can narrow a light distribution in the X direction of the light-emitting device 100. Accordingly, the light source device 200 in which the light-emitting device 100 is mounted can have a small viewing angle.

For example, when an epoxy resin and the like are used as the material of the mold resin member 40, and an index of refraction of the mold resin member 40 is 1.5, the critical angle is 42 degrees under the condition in which the outside is air. The inclined surface 421 of the inclined portion 42 can be represented by, for example, a normal line inclination angle θ3 being an angle formed between the normal line L11 and the straight line L1. Further, the normal line inclination angle θ3 can also be represented as a sum of the traveling angle θ0 and the incident angle θ1. Thus, at each of the points of the inclined surface 421, the inclined portion 42 is inclined such that magnitude of the normal line inclination angle θ3 is equal to or more than a value acquired by adding 42 degrees to magnitude of the traveling angle θ0, and thus the light traveling from the light-emitting element 20 to the inclined surface 421 can be totally reflected. Note that the critical angle is an incident angle at which a refractive angle is 90 degrees.

The inclined portion 42 is located between the lens portion 43 located above the light-emitting element 20 and the fixing portion 41 in which the light-emitting element 20 is disposed, and the inclined surface 420 at least partially spreads from the boundary with the lens portion 43 toward the boundary with the fixing portion 41. Thus, the size of the lens portion 43 can be adjusted independently from the fixing portion 41, and a degree of freedom of setting the directional characteristic and the like of the light emitted from the light-emitting device 100 can be improved by using the inclined surface 420 of the inclined portion 42. For example, when the light-emitting device 100 is used as a light source device, illumination on an unnecessary portion can be suppressed by narrowing the light distribution of the light of the light-emitting device 100 emitted in the X direction.

In the light-emitting device 100, because the lens portion 43, the inclined portion 42, and the fixing portion 41 are integrally formed, an effect of a boundary surface between the lens portion 43, the inclined portion 42, and the fixing portion 41 with respect to a traveling path of light can be suppressed, and the light from the light-emitting element 20 can be effectively used.

In the light-emitting device 100, in the plan view, because the inclined surface 420 of the inclined portion 42 is located on the straight line that passes through the vertex of the lens portion 43 and is in parallel to the X direction, the directional characteristic and the like can be adjusted in the X direction. Further, in the light-emitting device 100, because the inclined surface 420 of the inclined portion 42 is located on the straight line that passes through the vertex of the lens portion 43 and is in parallel to the Z direction, the directional characteristic and the like can also be adjusted in the Z direction.

The inclination length A1 is longer than the inclination length A2, and thus an area of the inclined surface 420 of the inclined portion 42 can be increased, and thus the degree of freedom of setting the directional characteristic of the light from the light-emitting element 20 in the inclined surface 420 of the inclined portion 42 can be improved. Further, the inclination angle in the cross section along the XY plane is greater than the inclination angle in the cross section along the YZ plane, and thus a blocking effect can be improved and the light distribution can be narrowed. In the light-emitting device 100, the inclined cross-sectional area of the inclined portion 42 in the X direction is greater than the inclined cross-sectional area of the inclined portion 42 in the Z direction, and thus the light distribution in the X direction can be efficiently narrowed. In other words, because a height of the connection points of the inclined portion 42 to the fixing portion 41 is the same in the Y direction, the inclined cross-sectional area is increased when the connection point is longer in the Z direction or the X direction. In other words, this means that the inclination angle is increased, and the blocking effect can be improved and the light distribution can be narrowed.

In the light-emitting device 100, the first lead 12 and the second lead 11 include the connection end portions 124 and 114 exposed from the mold resin member 40, and thus the first lead 12 and the second lead 11 can be used as they are for connection to the outside.

In the light source device 200, the light distribution of the light emitted from the light-emitting device 100 can be adjusted by changing only the outer periphery of the lens portion 43 without changing the outer periphery of the fixing portion 41. For example, when the outer periphery of the fixing portion 41 is constant, a lens portion having a small periphery allows the light distribution to be small as compared to a lens portion having a greater periphery. In other words, in the light-emitting device 100, the outer periphery of the fixing portion 41 in the plan view is greater than the outer periphery of the lens portion 43, and thus spread of the light distribution of the lens portion 43 can be reduced. Thus, brightness of the light-emitting device 100 can be improved.

The light-emitting device 100 includes the inclined surface 420 being curved and inclined, and can thus finely change the directional characteristic and the like while smoothly changing the inclination.

In the light-emitting device 100, the light-emitting element 20 is mounted on the bottom flat surface 151 of the recessed portion 151, and thus light laterally traveling can be reflected upward by the lateral wall 155 of the recessed portion 15, and the light distribution can be effectively narrowed.

In the light-emitting device 100, the inclined portion 42 is located above the upper edge of the lateral wall 155 of the recessed portion 15, and thus the directional characteristic and the like can be adjusted by effectively using the inclined surface 420 of the inclined portion 42.

In the light-emitting device 100, in the cross section taken along the X direction and the Y direction, the connection point of the inclined portion 42 to the fixing portion 41 is located between the straight line L1 passing through the upper end portion of the lateral wall 155 of the recessed portion 15 and being parallel to the X direction, and the straight line L2 connecting the upper end portion 25A of the lateral surface of the light-emitting element 20 close to the inclined portion 42 and the upper end portion 153A of the lateral wall 155 of the recessed portion 15. Thus, light that does not travel above the lateral wall 155 can be reflected by the lateral wall 155, and the inclined portion 42 can be disposed for light traveling above the lateral wall 155. The light traveling above the lateral wall 155 is refracted or totally reflected by the inclined portion 42.

In the light-emitting device 100, the upper edge of the fixing portion 41 is located at the same height as the upper end portion of the recessed portion 15 or located above the upper end portion, and thus the fixing portion 41 can cover the recessed portion 15 to the lateral wall 155, and the recessed portion 15 can be integrally fixed to the first lead 12 and the second lead 11.

In the light-emitting device 100, the lens portion 43 and the fixing portion 41 have the substantially elliptical shape in the plan view, and thus the directional characteristic and the like having anisotropy in a long diameter direction and a short diameter direction can be set.

In the light-emitting device 100, the length in the X direction of the fixing portion 41 in the plan view is in a range from 3.4 mm to 4.4 mm, and preferably in a range from 3.6 mm to 4.2 mm, and the length in the Z direction is in a range from 2.5 mm to 3.5 mm, and preferably in a range from 2.7 mm to 3.3 mm. Thus, the mold resin member 40 in the X direction connecting the first lead 12 and the second lead 11 is thickened to ensure strength and the like, and the light-emitting device 100 can be aligned with increased mounting density in the Z direction when the light-emitting device 100 is mounted in the light source device 200.

In the light-emitting device 100, the longest length of the lens portion 43 in the Y direction is in a range from 0.5 mm to 3.5 mm, and preferably in a range from 0.8 mm to 2.5 mm, and thus the shape of the lens portion 43 can be freely set.

In the light-emitting device 100, the longest length of the mold resin member 40 in the Y direction is in a rage from 5.5 mm to 9.5 mm, and preferably in a range from 6.5 mm to 8.2 mm, and thus a length H1 of the fixing portion 41 enough to fix the first lead 12 and the second lead 11 can be ensured. Further, a length enough to protect the light-emitting element 20 and the like can be ensured by increasing an entry path against water and the like that enter from the outside via the first lead 12 and the second lead 11.

Note that the inclined portion 42 preferably includes an inclined surface 420 that has substantially no protrusion and depression. The light-emitting device 100 can adjust the directional characteristic and the like by using a characteristic such as refraction and reflection by the surface having substantially no protrusion and depression. The inclined portion 42 can be formed by combining the inclined surfaces that has substantially no protrusion and depression and different inclination.

The inclined surface 420 of the inclined portion 42 can have the same inclination of the inclined surface 420 as that of the inclined surface facing in the X direction or the Z direction, or can have different inclinations on the first lead 12 side and the second lead 11 side, for example.

The inclined surface 420 of the inclined portion 42 can be provided on at least a part of the outer periphery of the lower end portion of the lens portion 43. For example, an inclined surface 420 can be provided only on the lower end portion of the lens portion 43 on the second lead 11 side in the X direction.

The lens portion 43 can have the substantially elliptical shape with the X direction as a minor axis or the substantially circular shape in the plan view. The fixing portion 41 can have the substantially elliptical shape with the X direction as the minor axis, or the substantially circular shape in the plan view. Both of the shapes of the lens portion 43 and the fixing portion 41 in the plan view can be the substantially elliptical shape or the substantially circular shape, or one of these shapes can be the substantially elliptical shape and the other can be the substantially circular shape.

MODIFICATION EXAMPLES

Figure 5A:
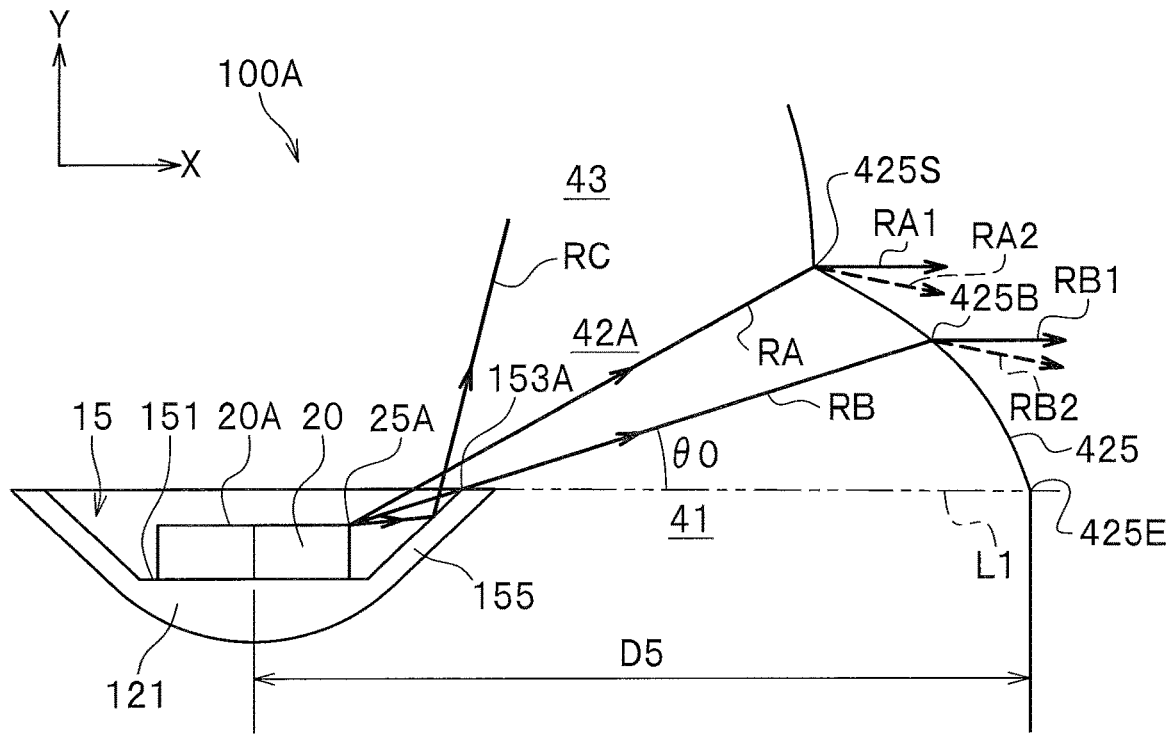
FIG. 5A is a schematic cross-sectional view exemplifying a part of a first modification example of an inclined portion.
Figure 5B:
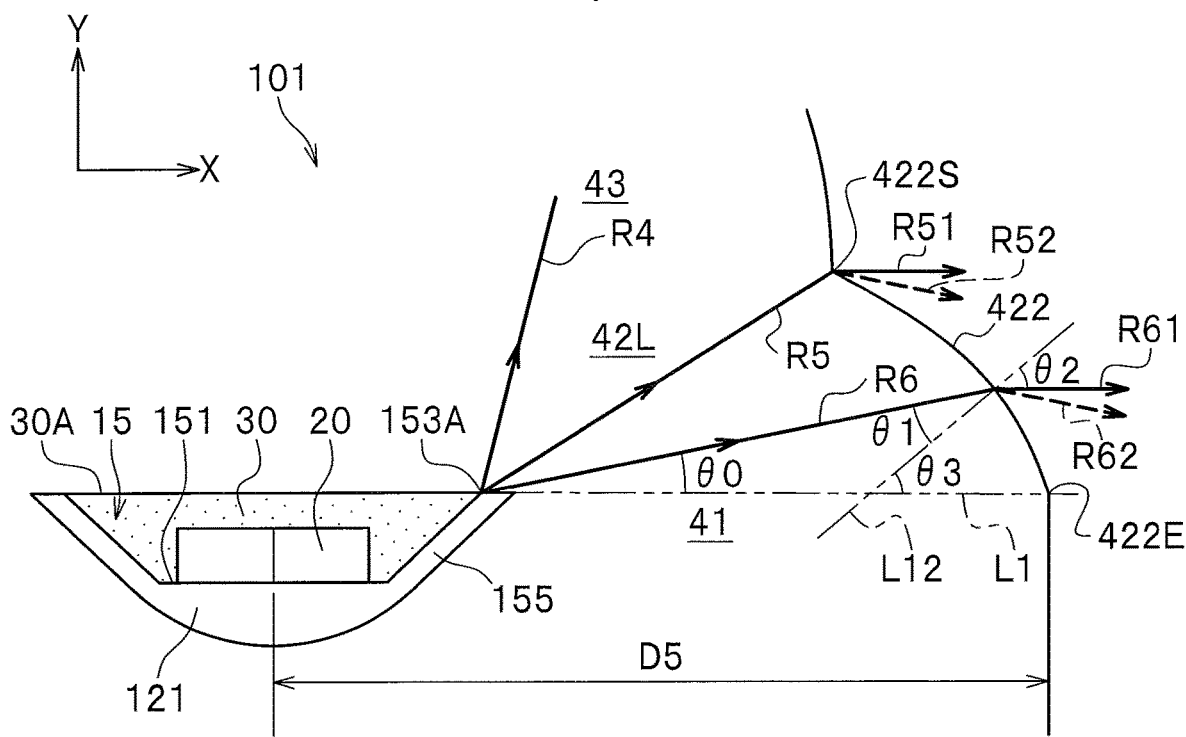
FIG. 5B is a schematic cross-sectional view exemplifying a part of a second modification example of the inclined portion.
Figure 5C:
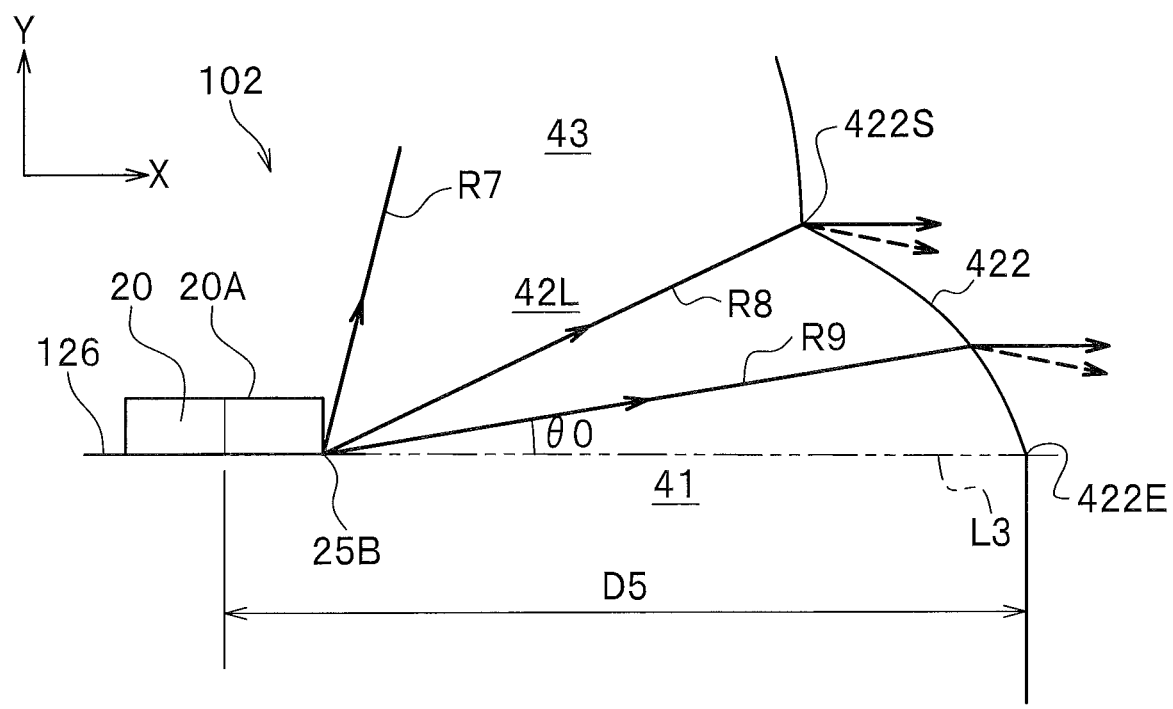
FIG. 5C is a schematic cross-sectional view exemplifying a case in which a cup portion is not included in FIG. 5B.

Next, modification examples of the inclined portion will be described with reference to FIGS. 5A to 5C. FIG. 5A is a schematic cross-sectional view exemplifying a part of a light-emitting device 100A according to a first modification example of the inclined portion. FIG. 5B is a schematic cross-sectional view exemplifying a part of a light-emitting device 101 according to a second modification example of the inclined portion. FIG. 5C is a schematic cross-sectional view exemplifying a part of a light-emitting device 102 that does not include the cup portion in the second modification example of the inclined portion. FIGS. 5A to 5C are schematic cross-sectional views exemplified except for the first lead 12, the second lead 11, and the conductive members 21 and 22, and do not illustrate hatching.

Note that, in the cross section along the X direction and the Y direction passing through the center of the lens portion 43 in the plan view, light traveling along the cross section is described as an example.

The light-emitting device 100A according to the first modification example of the inclined portion is different from the light-emitting device 100 in an inclined portion 42A, and has a configuration as the same as or similar to the light-emitting device 100 in the other points. As illustrated in FIG. 5A, in the light-emitting device 100A, a portion of the inclined surface 425 of the inclined portion 42A overlaps in the X direction, with the upper end portion of the lateral wall 155 in the Y direction. A connection point 425E of the inclined portion 42A connecting to the fixing portion 41 is located on the straight line L1 passing through the upper end portion of the lateral wall 155 of the recessed portion 15 and being parallel to the X direction. Note that a distance D5 from the center of the bottom flat surface 151 of the recessed portion 15 to the surface of the fixing portion 41 in the X direction is the same as the distance D5 in the light-emitting device 100. Further, a positional relationship between the cup portion 121 and the lens portion 43 is the same as or similar to that of the light-emitting device 100.

In the light-emitting device 100A, in the cross section taken along the X direction being the first direction and the Y direction being the third direction, among the light emitted from the light-emitting element 20, light passing through a connection point 425S of the inclined portion 42A, which is a point connected to the lens portion 43, exits along a straight line passing through the connection point 425S and being parallel to the X direction, or exits below the straight line parallel to the X direction.

Light RA is an example of light being emitted from the light-emitting element 20 and passing through the connection point 425S of the inclined portion 42A, which is a point connected to the lens portion 43. Light RA1 of the light RA exiting to the outside travels along the straight line passing through the connection point 425S of the inclined portion 42A, which is a point connected to the lens portion 43, and being parallel to the X direction. By adjusting the inclined surface 425 of the inclined portion 42A, light such as exiting light RA2 can exit below the straight line parallel to the X direction.

In the light-emitting device 100A, in the cross section taken along the X direction and the Y direction, among the light emitted from the light-emitting element 20, the light passing through the connection point 425S of the inclined portion 42A, which is a point connected to the lens portion 43, exits along the straight line passing through the connection point 425S and being parallel to the X direction, or exits below the straight line parallel to the X direction. Thus, the light distribution in the X direction of the light-emitting device 100A can be narrowed.

The light RA passes through the connection point 425S of the inclined portion 42A, which is a point connected to the lens portion 43, from a position of the upper end portion 25A of the lateral surface of the light-emitting element 20.

Note that, in the cross section along the X direction and the Y direction passing through the center of the lens portion 43 in the plan view, the inclined surface 425 of the inclined portion 42A can at least have an angle at which the light RA exits along the straight line passing through the connection point 425S and being parallel to the X direction, or exits below the straight line parallel to the X direction.

Light RB is an example of light is emitted from the position of the upper end portion 25A of the lateral surface of the light-emitting element 20, passing through near the upper end portion 153A of the lateral wall 155 of the recessed portion 15, and traveling without being reflected by the lateral wall 155. Light RC is an example of light reflected by the lateral wall 155. The light RB is emitted to the outside passing through a point 425B on the inclined surface 425 of the inclined portion 42A. The inclined surface 425 of the inclined portion 42A preferably has an angle at which light RB1 of the light RB exiting to the outside travels in the X direction or below the X direction.

Next, the light-emitting device 101 according to the second modification example of the inclined portion will be described. The light-emitting device 101 is different from the light-emitting device 100 in that the light-transmissive member 30 described below is provided in the recessed portion 15 and in an inclined portion 42L, and has a configuration as the same as or similar to the light-emitting device 100 in the other points. As illustrated in FIG. 5B, the light-emitting device 101 includes the light-transmissive member 30 filling the recessed portion 15 to a position of the upper end portion of the lateral wall 155, and includes an upper surface 30A of the light-transmissive member 30. An inclined surface 422 of the inclined portion 42L is provided to a position of the upper end portion of the lateral wall 155 in the Y direction. A connection point 422E of the inclined portion 42L, which is a point connected to the fixing portion 41 is located on the straight line L1 passing through the upper end portion of the lateral wall 155 of the recessed portion 15 and being parallel to the X direction. Note that the distance D5 from the center of the bottom flat surface 151 of the recessed portion 15 to the surface of the fixing portion 41 in the X direction is the same as that in the light-emitting device 100. Further, a positional relationship between the cup portion 121 and the lens portion 43 is the same as or similar to that of the light-emitting device 100.

In the light-emitting device 101, in the cross section along the X direction and the Y direction, light traveling from the upper surface 30A of the light-transmissive member 30 to the inclined surface 422 of the inclined portion 42L is refracted to the X direction or below the X direction, and exits from the inclined surface 422 to the outside.

For example, light R4 emitted upward from the upper surface 30A of the light-transmissive member 30 travels to the lens portion 43. The light traveling to the lens portion 43 is condensed upward by the lens portion 43, and exits to the outside.

Light R5 and R6 traveling from the upper surface 30A to the inclined surface 422 of the inclined portion 42L is refracted at the inclined surface 422 and exits to the X direction or below the X direction. By adjusting the inclined surface 422 of the inclined portion 42L, light such as emitted light R52 and R62 can be set as emitted light being refracted and traveling below the X direction. A refractive angle $\theta2$ of the exiting light R52 and R62 is greater than that of exiting light R51 and R61. In other words, the refractive angle $\theta2$ of exiting light traveling downward is greater than that of exiting light traveling in the X direction. The inclined surface 422 of the inclined portion 42L is set such that magnitude of the refractive angle $\theta2$ is equal to or more than the inclination angle $\theta3$ inclined to the normal line. Note that, as long as the exiting light is not refracted and exiting above the X direction, the exiting light can be totally reflected.

The light-emitting device 101 refracts light to the X direction or below the X direction at the inclined portion 42L adjacent to the lens portion 43. In this way, the light distribution in the X direction of the light-emitting device 101 can be narrowed.

In the light-emitting device 101, the light advancing direction is changed by the light-transmissive member 30, and thus light having a small traveling angle $\theta0$ travels without reflection by the lateral wall 155. When the size of the light-emitting device is limited and, for example, the distance D5 cannot be increased, an inclination that totally reflects the light having the small traveling angle $\theta0$ cannot be provided. Even in such a case, the light-emitting device 101 can emit refracted light to the X direction or below the X direction by the inclined portion 42L and narrow the light distribution without changing the positional relationship between the cup portion 121 and the lens portion 43, and the distance D5.

The light-transmissive member 30 is disposed in the recessed portion 15 and covers the light-emitting element 20. Examples of a material of the light-transmissive member 30 include a transmissive resin, glass, and the like, such as an epoxy resin, a urea resin, an acrylic resin, and a silicone resin. The light-transmissive member 30 has transmissivity or a transparent body. The light-transmissive member 30 can contain a filler such as a diffusing material. Containing the filler in the light-transmissive member 30 can reduce a change in light distribution. Further, the light-transmissive member 30 can contain a coloring agent, a light stabilizer, a phosphor, and the like. For the coloring agent, the filler, the light stabilizer, and the phosphor, those described in the mold resin member 40 can be used.

The light-emitting device 101 includes the light-transmissive member 30 in the recessed portion 15, and thus the mold resin member 40 does not directly contact the light-emitting element 20 and the mold resin member 40 is also not disposed near the light-emitting element 20. Thus, deterioration of the mold resin member 40 due to heat from the light-emitting element 20 can be suppressed. In this way, a life of the light-emitting device 101 can be further increased.

Next, the light-emitting device 102 according to the second modification example of the inclined portion will be described. As illustrated in FIG. 5C, the light-emitting device 102 includes the inclined portion 42L similar to that of the light-emitting device 101. The light-emitting device 102 is different from the light-emitting device 101 in that the recessed portion 15 is not provided and the light-emitting element 20 is mounted on a die pad 126 formed on an upper end of the first lead 12. Further, the light-transmissive member 30 is not disposed, and the mold resin member 40 directly covers the light-emitting element 20. The light-emitting device 102 has a configuration as the same as or similar to the light-emitting device 101 in the other points. Light is emitted from the upper surface 20A and the lateral surface of the light-emitting element 20. In this case, a position of an upper surface of the die pad 126 is preferably adjusted so as to have substantially the same height as that of a position of the connection point 422E of the inclined portion 42L to the fixing portion 41.

For example, light R7, R8, and R9 emitted from a lower end portion 25B of the light-emitting element 20 travels similarly to the light R4, R5, and R6 described in the light-emitting device 101, and exits to the outside. The light-emitting device 102 does not include the recessed portion 15, and thus light emitted from the lower end portion 25B of the light-emitting element 20 is described as an example. The reason is that the light emitted from the lower end portion 25B has the greatest traveling angle.

In the light-emitting device 102, because the light-emitting element 20 is not surrounded by the lateral wall 155 of the recessed portion 15, the light having the small traveling angle θ0 travels without reflection similarly to the light-emitting device 101. Similarly to the light-emitting device 101, the light-emitting device 102 refracts light to the X direction or below the X direction at the inclined portion 42L adjacent to the lens portion 43. In this way, the light distribution in the X direction of the light-emitting device 102 can be narrowed.

Note that the upper surface 20A of the light-emitting element 20 can be set in the position of the lower end portion of the inclined portion 42L by adjusting a position of the upper end portion of the fixing portion 41 without adjusting the die pad 126.

Figure 6A:
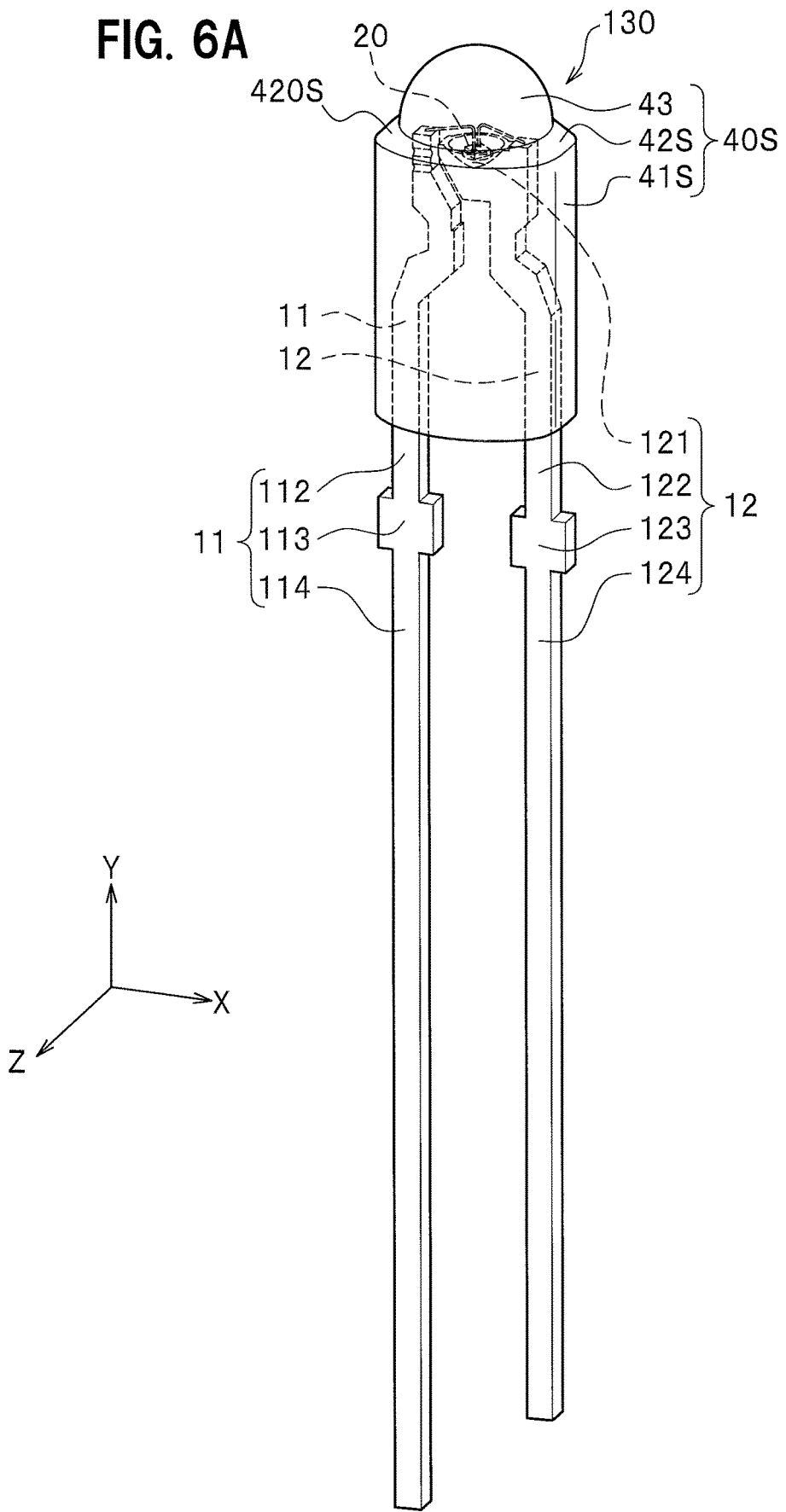
FIG. 6A is a schematic perspective view exemplifying a modification example of a fixing portion.

Next, a modification example of the fixing portion and a modification example of the size relationship between the lens portion and the fixing portion will be described with reference to FIGS. 6A to 6D. A point other than the fixing portion and the size relationship between the lens portion and the fixing portion has a configuration the same as or similar to the light-emitting devices 100 and 101. FIGS. 6A and 6B are respectively a schematic perspective view and a schematic plan view exemplifying a light-emitting device 130 according to the modification example of the fixing portion. FIGS. 6C and 6D are schematic plan views illustrating light-emitting devices 140A and 140B according to the modification example of the size relationship between the lens portion and the fixing portion in the Z direction being the second direction.

As shown in FIG. 6B, in the light-emitting device 130, an end portion of a fixing portion 41S in the X direction is formed in a planar shape. Further, in the plan view, an outer periphery of the fixing portion 41S includes a linear portion along the Z direction. In the fixing portion 41S, the linear portion includes a lateral flat surface. A length D6 of the linear portion is approximately ⅕ of the longest length D4 in the Z direction. The length D6 can be, for example, approximately ⅘ of the length D4. In the plan view, the length D1, D2, D3, and D4 are respectively the same as the length D1, D2, D3, and D4 of the light-emitting device 100.

As shown in FIG. 6A, an inclined portion 42S is formed continuous with the fixing portion 41S whose outer periphery of the upper end portion includes the linear portion along the Z direction. Similarly to the light-emitting device 100, an inclined surface 420S of the inclined portion 42S has an angle at which the light from the light-emitting element 20 can be totally reflected. Alternatively, the inclination has an angle at which the light can be refracted in parallel with or below the X direction.

In comparison to a case in which the lower end portion of the inclined portion has the substantially elliptical shape, the entire linear portion of the inclined portion 42S in the light-emitting device 130 can have an angle of the inclination of the inclined portion at which the light is totally reflected or refracted in parallel with or below the X direction.

The outer periphery of the lower end portion of the inclined portion 42S includes the linear portion along the Z direction, and thus the light distribution in the X direction of the light-emitting device 130 can be narrowed, and whose viewing angle in a direction forming, for example, 45 degrees with the X direction.

As shown in FIG. 6C, the length D2 of the lens portion 43 in the Z direction in the plan view can be the same as the length D4 of the fixing portion 41. In the light-emitting device 140A, the inclined surface 420 of the inclined portion 42 is disposed only in the X direction. The lens portion 43 has the same length as that of the fixing portion 41 in the Z direction. The light-emitting device 140A in which the lens portion 43 and the fixing portion 41 are connected without interposing the inclination of the inclined portion 42 in the Z direction is exemplified. The length D1, D3, and D4 of the light-emitting device 140A are respectively the same as the length D1, D3, and D4 of the light-emitting device 100.

Further, as shown in FIG. 6D, the length D2 of the lens portion 43 in the Z direction in the plan view can be longer than the length D4 of the fixing portion 41. The light-emitting device 140B in which the inclination surface 420 of the inclined portion 42 is disposed in the X direction, the lens portion 43 is longer than the fixing portion 41 in the Z direction, and the fixing portion 41 is connected below the lens portion 43 is exemplified. Note that the light-emitting devices 140A and 140B can be combined with the linear portion of the fixing portion 41S in the light-emitting device 130. For example, the length D2 of the lens portion 43 in the Z direction is in a range from 2.3 mm to 3.3 mm. The length D1, D3, and D4 of the light-emitting device 140B are respectively the same as the length D1, D3, and D4 of the light-emitting device 100.

In the light-emitting devices 140A and 140B, the length D2 of the lens portion 43 in the Z direction in the plan view is equal to or longer than the length D4 of the fixing portion 41, and thus a degree of freedom for adjusting the directional characteristic and the like can be further improved. Further, by reducing the size of the fixing portion 41, mounting density in the light source device 200 described below can be improved.

As shown in FIG. 6E, the lens portion 43 can have a long axis in the Z direction. For example, in the lens portion 43 of the light-emitting device 140C, the length D1 in the X direction is in a range from 1.9 mm to 2.9 mm, and the length D2 in the Z direction is in a range from 2.3 mm to 3.3 mm. Accordingly, the light distribution in the X direction can be narrowed. The length D1, D3, and D4 of the light-emitting device 140C are respectively the same as the length D1, D3, and D4 of the light-emitting device 100.

Method for Manufacturing Light-Emitting Device

Figure 7:
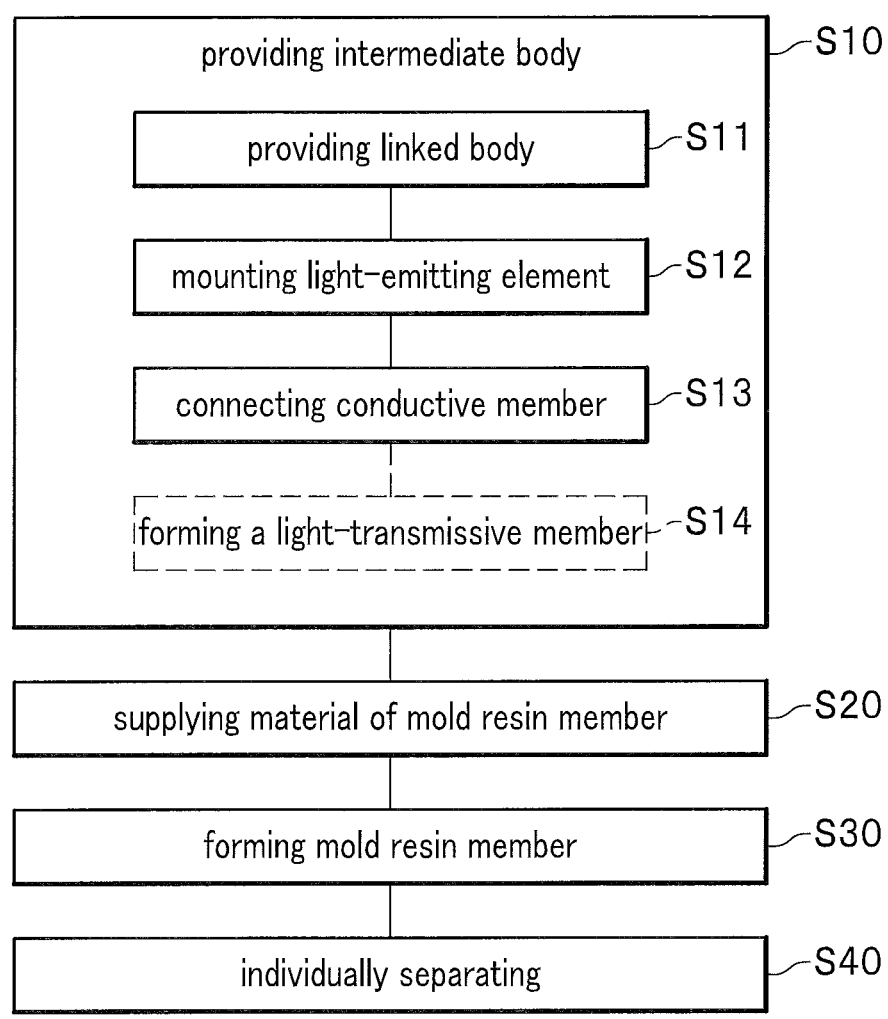
FIG. 7 is a flowchart exemplifying a method for manufacturing the light-emitting device according to the embodiment.
Figure 8A:
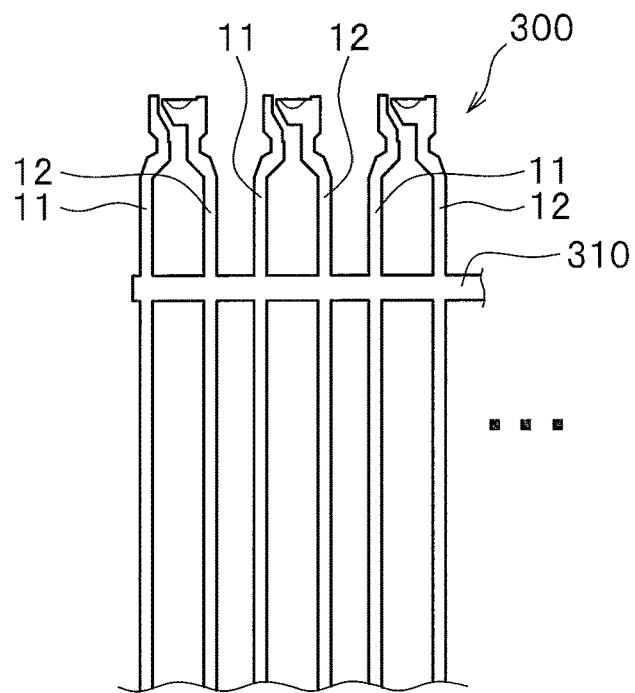
FIG. 8A is a schematic lateral side view exemplifying a part of a linked body provided in a step of the method for manufacturing the light-emitting device according to the embodiment.
Figure 8B:
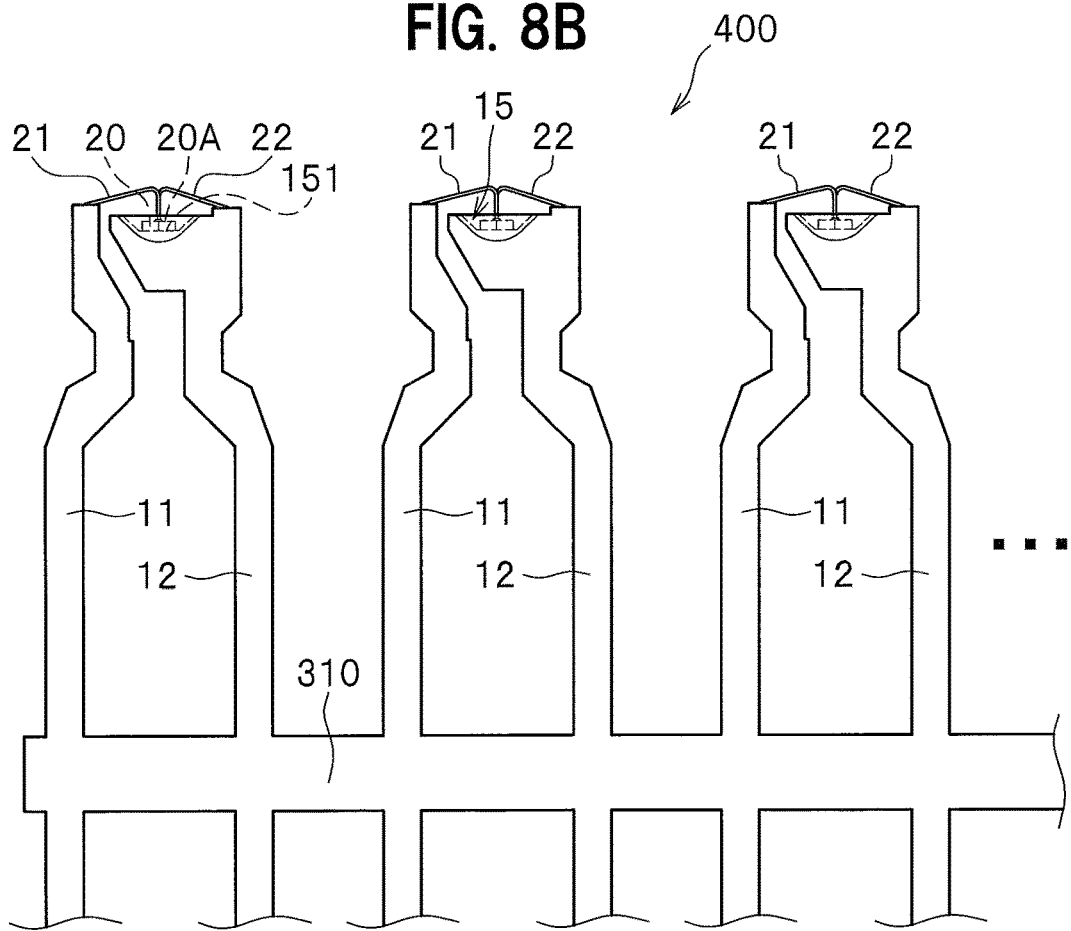
FIG. 8B is a schematic lateral side view exemplifying a part of an intermediate body in which the light-emitting elements are mounted on the linked body and connected to the first lead and the second lead with the conductive member in the step of the method for manufacturing the light-emitting device according to the embodiment.
Figure 8C:
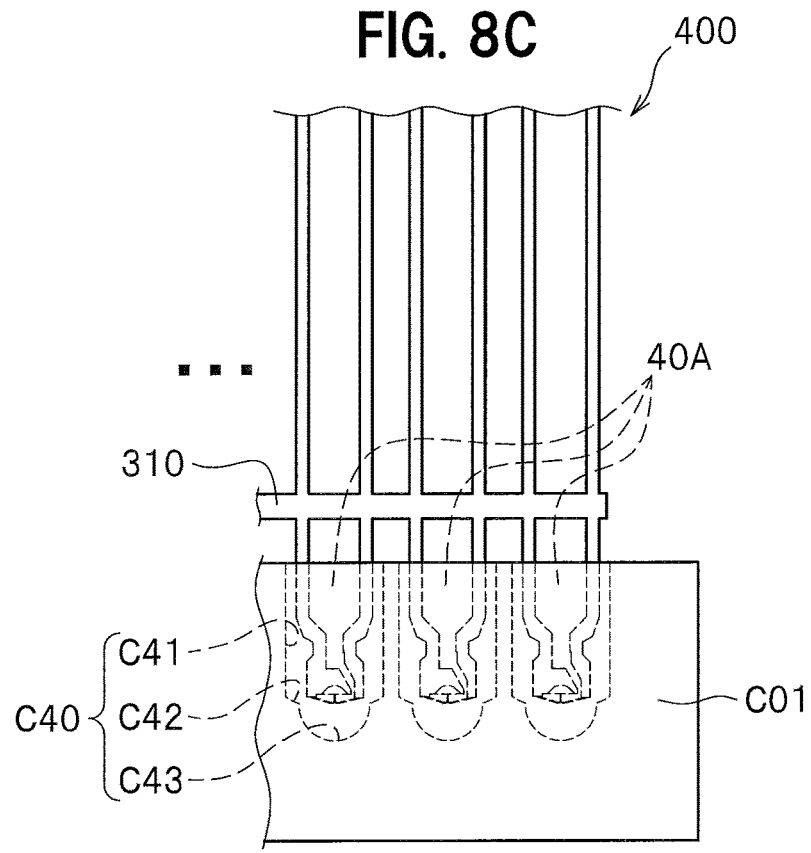
FIG. 8C is a schematic lateral side view exemplifying a part of a state where the intermediate body is inserted into a recess of a casting case in which a material of the mold resin member is supplied in the step of the method for manufacturing the light-emitting device according to the embodiment.
Figure 8D:
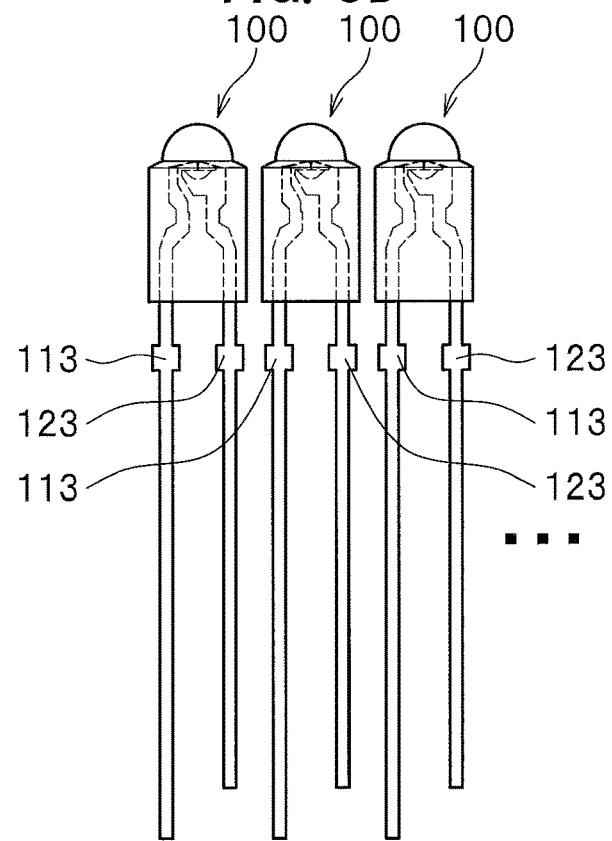
FIG. 8D is a schematic lateral side view exemplifying a part acquired by cutting off and individually separating a linked portion in the step of the method for manufacturing the light-emitting device according to the embodiment.

Next, the method for manufacturing the light-emitting device according to the embodiment will be described with reference to FIGS. 7 to 8D. FIG. 7 is a flowchart exemplifying the method for manufacturing the light-emitting device 100. FIG. 8A is a schematic lateral side view exemplifying a part of a linked body 300 provided in the method for manufacturing the light-emitting device 100. FIG. 8B is a schematic lateral side view exemplifying a part of an intermediate body 400 in which the light-emitting elements 20 are mounted on the linked body 300 and connected to the first lead 12 and the second lead 11 with the conductive members 21 and 22 in the method for manufacturing the light-emitting device 100. FIG. 8C is a schematic lateral side view exemplifying a part of a state where the intermediate body 400 is inserted into a recess C40 of a casting case C01 filled with a material 40A of the mold resin member in the method for manufacturing the light-emitting device 100. FIG. 8D is a schematic lateral side view exemplifying a part acquired by cutting off and individually separating a linked portion 310 in the method for manufacturing the light-emitting device 100.

The method for manufacturing the light-emitting device 100 includes: step S10 of providing an intermediate body 400 in which light-emitting elements 20 mounted on first leads 12 of linked bodies 400 comprising one or more pairs of the first lead 12 and a second lead 11 with a linked portion 310, and the light-emitting element 20 and the second lead 11 are electrically connected via a conductive member 21 in the one or more pairs; step S20 of supplying a material 40S of a mold resin member in recesses C40 in a casting case C01; step S30 of inserting the intermediate body 400 into the recesses C40 in which the material 40A of the mold resin member is supplied, and forming the mold resin member configured to directly or indirectly cover the light-emitting elements 20 for each pair of the first lead 12 and the second lead 11; and individually separating S40 by cutting off the linked portion 310 of the linked body 300 so as to make the pairs each comprising the first 12 lead and the second lead 11 In step S20 of the supplying of the material 40A of the mold resin member in the recess, the casting case C01 has a lens portion opening C43 on a bottom side of the casting case C01, an inclined portion opening C42 connected from the lens portion opening C43 and spreading and inclined toward an opening side of the casting case C01, and a fixing portion opening C41 connected from the inclined portion opening C42 toward the opening side of the casting case C01. In step S30 of forming the mold resin member 40, the light-emitting element 20 is disposed inside the fixing portion opening C41.

Step of Providing Intermediate Body

Step S10 of providing an intermediate body is a step of providing the intermediate body 400 before the mold resin member 40 is provided. Step S10 of providing an intermediate body includes step S11 of providing a linked body, step S12 of mounting a light-emitting element, and step S13 of connecting a conductive member.

Step S11 of providing a linked body is a step of providing the linked body 300 acquired by repeatedly linking the pair of the first lead 12 and the second lead 11 with the linked portion 310. In this step, for example, the first lead 12 and the second lead 11 shaped into a desired shape are formed on a base frame.

Step S12 of mounting a light-emitting element is a step of mounting the light-emitting elements 20 on the linked body 300. In this step, the light-emitting element 20 is mounted on the bottom flat surface 151 of the recessed portion 15 of the cup portion 121 of the first lead 12 via an adhesive member.

Step S13 of connecting a conductive member is a step of electrically connecting the light-emitting element 20, and the first lead 12 and the second lead 11 via the conductive members 21 and 22 such as the wire. In this step, one of the element electrodes of the light-emitting element 20 is connected to the first lead 12 via the conductive member 22, and the other element electrode is connected to the second lead 11 via the conductive member 21.

Step S10 of providing an intermediate body can be provided with step S14 of forming a light-transmissive member after step S13 of connecting a conductive member. In step S14, the material of the light-transmissive member prior to curing is injected and cured in the recessed portion 15 to form the light-transmissive member 30 that covers the light-emitting element 20.

Step of Supplying Material of Mold Resin Member

Step S20 of supplying a material of a mold resin member is a step of supplying the material 40A of the mold resin member prior to curing in the casting case C01. The casting case C01 includes the plurality of recesses C40 corresponding to a shape of the mold resin members 40 of the light-emitting device 100. The casting case C01 can be, for example, a die and the like.

Each of the recesses C40 continuously includes, from the bottom side to the opening side of the recess C40, the lens portion opening C43 corresponding to a shape of the lens portion 43 of the light-emitting device 100, the inclined portion opening C42 corresponding to a shape of the inclined portion 42, and the fixing portion opening C41 corresponding to a shape of the fixing portion 41.

In the casting case C01, the bottom side of the recess C40 is disposed vertically downward, and a predetermined amount of the material 40A of the mold resin member prior to curing is injected from the opening side.

Step of Forming Mold Resin Member

Step S30 of forming a mold resin member is a step of forming the mold resin member 40 for each pair of first lead 12 and the second lead 11. In step S30, the intermediate body 400 is inserted into the recess C40 in which the material 40A of the mold resin member is supplied, and the mold resin member 40 that directly or indirectly covers the light-emitting element 20 is formed for each pair of the first lead 12 and the second lead 11.

The intermediate body 400 is inserted, from a side on which the light-emitting element 20 is mounted, into the recess C40 with the linked portion 310 exposed, and is fixed in a state where the light-emitting element 20 is disposed inside the fixing portion opening C41. The mold resin member 40 is formed by curing the material 40A of the mold resin member by heating and the like, and the casting case C01 is removed after curing.

Individually Separating Step

Individually separating step S40 is a step of cutting off the linked portion 310 of the linked body 300. The linked portion 310 is cut off so as to remain a part of the linked portion 310 on each of the first lead 12 and the second lead 11 as a protrusion. After cutting off the linked portion 310, individually separated light-emitting devices 100 are provided. After individually separating step S40, the light-emitting device 100 is completed.

In the method for manufacturing the light-emitting device 100, the pair of the first lead 12 and the second lead 11 can be held by the linked portion 310 of the linked body 300. Further, in the linked body 300, the pairs of first lead 12 and the second lead 11 are repeatedly linked, and thus a plurality of pairs can be collectively handled, and work can be efficiently performed.

In the method for manufacturing the light-emitting device 100, the lens portion 43, the inclined portion 42, and the fixing portion 41 can be integrally formed by forming the mold resin member 40 by casting. Further, the mold resin member 40 having a predetermined surface shape can be repeatedly and stably formed by adjusting a shape of the recess C40 of the casting case C01.

In the individually separating step of the method for manufacturing the light-emitting device 100, the linked portions 310 can be cut off such that the first lead 12 and the second lead 11 include the first linked portion 123 and the second linked portion 113. In this way, in the light-emitting device 100, for example, when the connection end portions 124 and 114 are inserted into a mounting substrate 60 described below and the light-emitting devices 100 is aligned, positions of upper end portions of the lens portions 43 can be aligned by disposing lower surfaces of the first linked portions 123 and the second linked portions 113 to face the mounting substrate 60.

Note that step S20 of supplying a material of a mold resin member can be performed together with step S30 of forming a next mold resin member. In other words, by supplying the material 40A of the mold resin member in a state where the intermediate body 400 is disposed in the casting case C01 including the plurality of recesses C40, the mold resin member 40 that directly or indirectly covers the light-emitting element 20 can be formed for each pair of the first lead 12 and the second lead 11 disposed inside the recess C40 of the casting case C01.

Further, the light-emitting devices 101, 102, 100A, 140A, and 140B can also be manufactured in a similar step by changing the shape of the recess C40 of the casting case C01. Note that, in the light-emitting device 100, the mold resin member 40 having a desired shape can be formed by shaving.

Figure 9A:
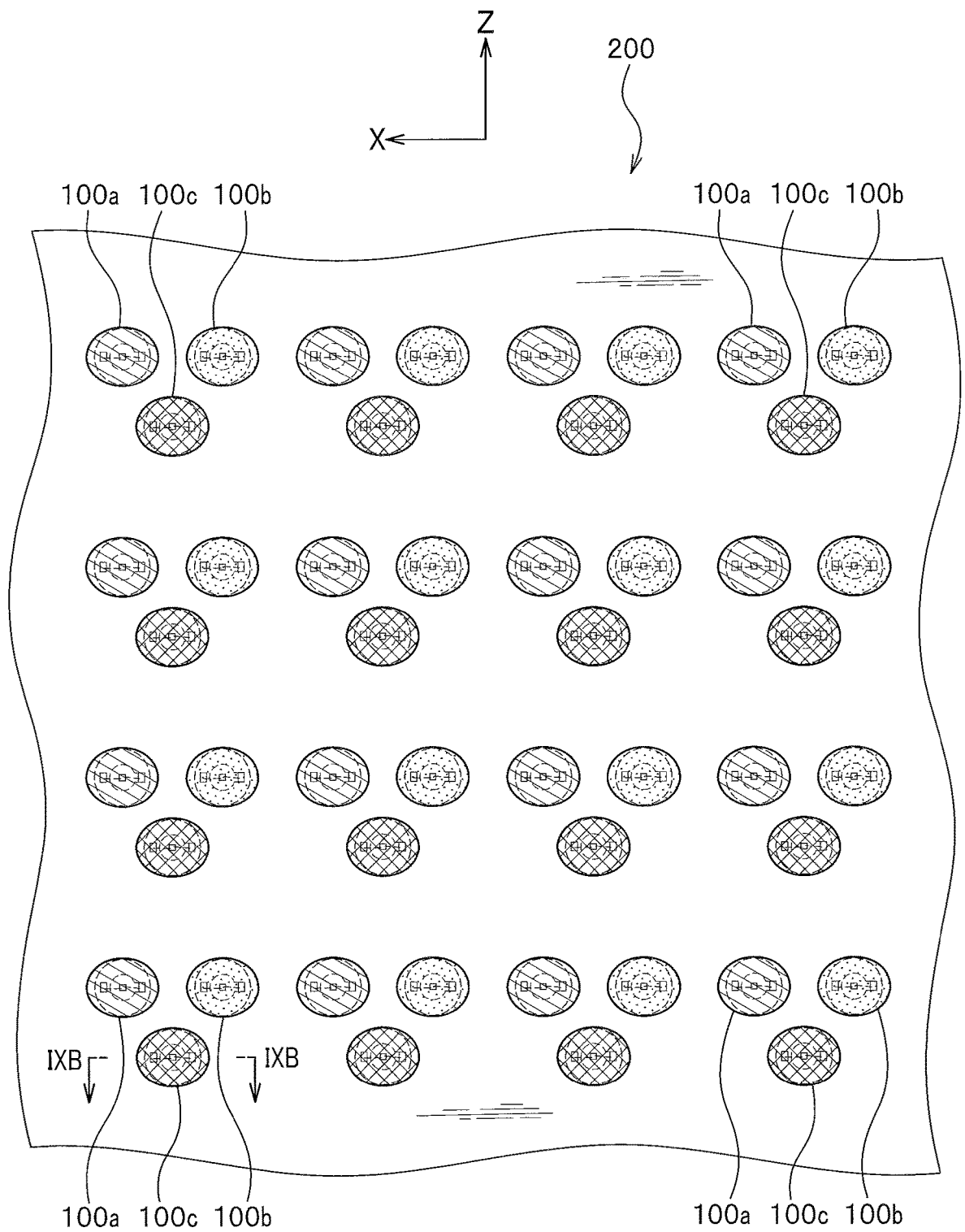
FIG. 9A is a schematic front view exemplifying the light source device according to the embodiment.
Figure 9B:
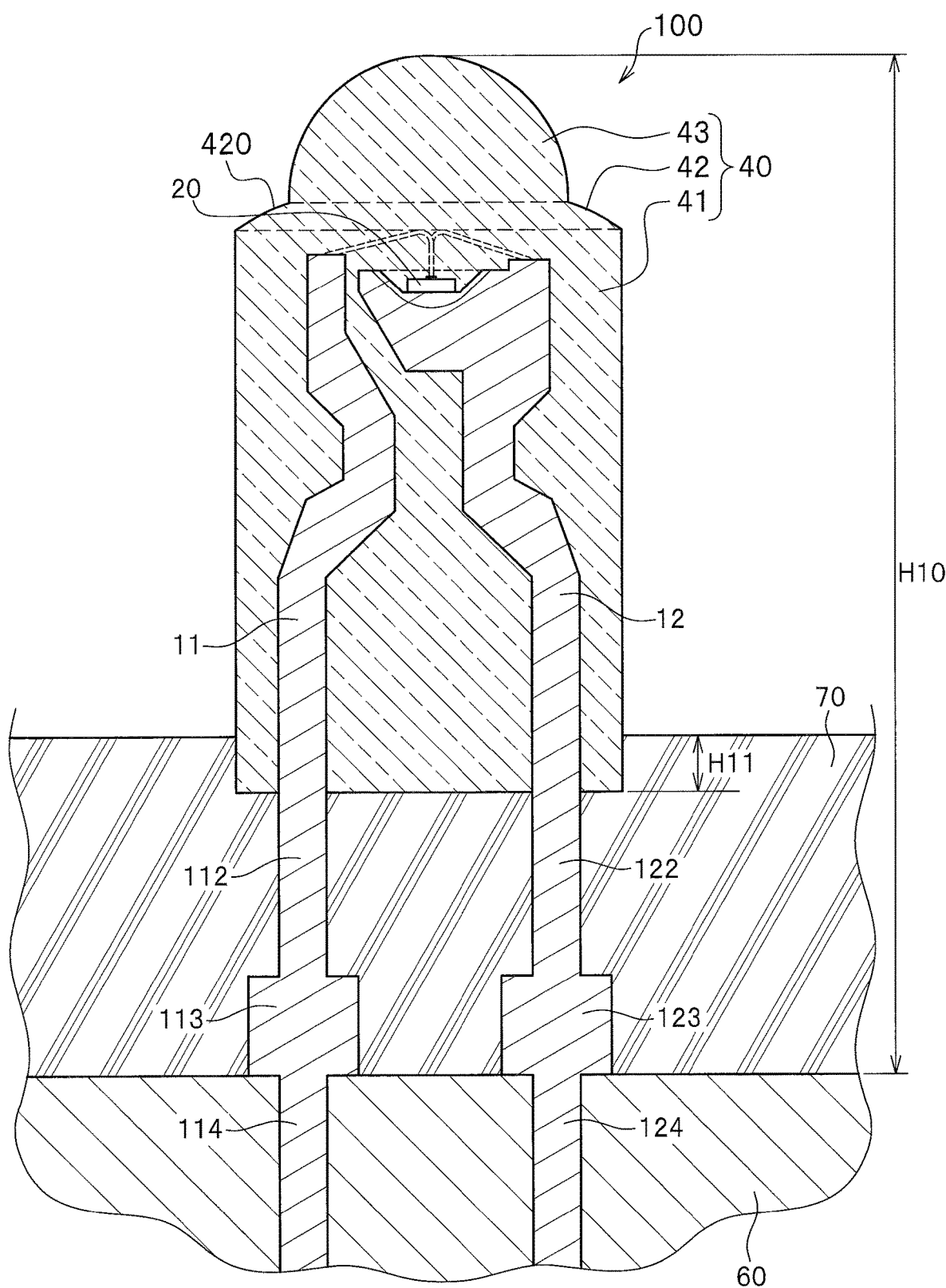
FIG. 9B is a schematic cross-sectional view exemplifying an enlarged part of the light source device according to the embodiment.

Next, the light source device 200 using the light-emitting device 100 will be described with reference to FIGS. 9A and 9B. FIG. 9A is a schematic front view exemplifying a part of the light source device 200. FIG. 9B is a schematic cross-sectional view exemplifying a state where the light-emitting device 100 is mounted on the light source device 200. Note that the light-emitting devices 101, 102, 100A, 140A, 140B, and the like described with reference to FIGS. 3A to 6D can be used instead of the light-emitting device 100.

The light source device 200 includes the plurality of the light-emitting devices 100 aligned such that the lens portions 43 constitute a display surface, and can control turning on/off and brightness of each of the light-emitting devices 100. Note that the up-and-down direction in the light-emitting device 100 is a direction perpendicular to the display surface of the light source device 200. Further, the light-emitting device 100 is disposed such that the X direction is a lateral direction on the display surface of the light source device 200. The inclined portion of the light-emitting device 100 is preferably disposed in parallel with the lateral direction of the display surface of the light source device 200. For example, when the inclined portion 42 is disposed with the lens portion 43 interposed therein along the first direction in the light-emitting device 100, the plurality of light-emitting devices are disposed in a direction parallel to the first direction.

Further, the plurality of light-emitting devices are preferably disposed in a plurality of rows in the light source device 200. Further, one set of three light-emitting devices across adjacent rows of the plurality of rows is preferably mounted in a position where a straight line imaginarily connecting the centers of the three light-emitting devices in each set makes a triangle. Further, each set configured of three light-emitting devices across adjacent rows of the plurality of rows can be mounted while the straight line imaginarily connecting the centers of the three light-emitting devices in each set is parallel to the direction perpendicular to the display surface of the light source device.

The light-emitting devices 100 having different emission colors can be aligned in the light source device 200. The light-emitting devices 100 can be a first light-emitting device 100a that emits blue light, a second light-emitting device 100b that emits green light, or a third light-emitting device 100c that emits red light. The mold resin members 40 can respectively contain, for example, blue, green, or red coloring agents. The light source device 200 that includes a plurality of sets of the light-emitting devices 100a, 100b, and 100c having the three colors aligned as one pixel for each set, and can perform display in full color can be achieved. An arrangement order of the light-emitting devices 100a, 100b, and 100c is not limited. Of the three light-emitting devices in each set, the light-emitting device 100b that emits the green light is preferably disposed at the center. The reason is that good white color can be obtained by disposing, at the center, the light-emitting device that emits light having a wavelength that requires the greatest brightness.

The light source device 200 can include a louver. The louver shields incident light such as sunlight applied to the display surface of the light source device 200. The louver can be disposed for each row, or can be disposed across a plurality of rows. In a case of the light source device 200 including the louver, the light-emitting device having low weather resistance is preferably disposed near the louver.

The light-emitting device 100 is mounted on the mounting substrate 60 of the light source device 200. For example, the entire length of the light-emitting device 100 is in a range from 25.5 mm to 29.5 mm. The entire length is preferably in a range from 26.8 mm to 28.5 mm. An attachment height of the light-emitting device 100 from an upper surface of the mounting substrate 60 is set by bonding an interface between the first linked portion 123 and the first connection end portion 124 and an interface between the second linked portion 113 and the second connection end portion 114 to the upper surface of the mounting substrate 60 when the light-emitting device 100 is mounted on the mounting substrate 60. For example, a height H10 of the upper end portions of the lens portions 43 can be aligned. The first linked portion 123 and the second linked portion 113 can be formed wide in the X direction. The first connection end portion 124 and the second connection end portion 114 are portions inserted into the mounting substrate 60 when the light-emitting device 100 is mounted on the mounting substrate 60. The first connection end portion 124 and the second connection end portion 114 are inserted into the mounting substrate 60 and connected to an external electrode.

The waterproof member 70 is provided on the mounting substrate 60 such that a part of the mold resin member 40 is embedded. Further, the waterproof member is disposed such that a part of the mold resin member is embedded between the light-emitting devices adjacent to each other. The waterproof member 70 protects the light-emitting device 100 and the mounting substrate 60 from water and the like. An overlapping thickness H11 of the waterproof member 70 and the mold resin member 40 is, for example, equal to or more than 0.5 mm, preferably equal to or more than 1.5 mm, and more preferably equal to or more than 3.0 mm. Examples of a material of the waterproof member 70 include an epoxy resin, a modified epoxy resin, a silicone resin, a modified silicone resin, and the like. In particular, it is preferable to employ a silicone resin having good light resistance and heat resistance. Further, the waterproof member 70 is preferably a black resin. By using the black resin, a contrast between the waterproof member 70 and emission light is increased, and display by the light source device 200 becomes clearer. Further, light that is reflected by the interface between the inclined portion 42 and the outside and travels to the mounting substrate 60 side can be absorbed. The inclined surface 420 of the inclined portion 42 is set in a range from an angle at which the light passing through the inclined portion 42 of the light emitted from the light-emitting element 20 is refracted and exits in parallel with the straight line L1 to an angle at which the light can be totally reflected. The light refracted and exiting in parallel and totally reflected by the inclined surface 420 of the inclined portion 42 travels to the mounting substrate 60 side, and is absorbed by the waterproof member 70. Thus, a region irradiated from the light source device 200 can be adjusted. For example, by narrowing the light distribution of the light-emitting device and adjusting a region of the display surface of the light source device 200 being irradiated in the lateral direction, brightness in a region desired to be illuminated by the light source device 200 can be maintained, and a light leakage can be suppressed or brightness can be suppressed in a region that does not need to be illuminated or is not desired to be illuminated.

The light-emitting device and the light source device according to the embodiment of the present disclosure can be suitably used for a display for outdoor use. In addition, the light-emitting device and the light source device according to the embodiment of the present disclosure can be used for a backlight light source of a liquid crystal display, various types of lighting fixtures, a display for indoor use, various types of display devices for advertisements, destination information, or the like, and the like.

What is claimed is:

1. A light-emitting device comprising:
a light-emitting element;
a first lead on which the light-emitting element is mounted;
a second lead configured to be electrically connected to the light-emitting element via a conductive member, and disposed away from the first lead along a first direction; and
a mold resin member configured to directly or indirectly cover the light-emitting element, wherein
the mold resin member includes
a lens portion located above the light-emitting element,
a fixing portion configured to fix the first lead and the second lead, and
an inclined portion located between the lens portion and the fixing portion, and having at least a portion spreading and inclined from a first boundary between the inclined portion and the lens portion toward a second boundary between the inclined portion and the fixing portion,
a length in the first direction of the lens portion between a center of the lens portion and the first boundary is larger than a length in the first direction of the inclined portion between the first boundary and the second boundary, and
the light-emitting element is disposed inside the fixing portion.

2. The light-emitting device according to claim 1, wherein the inclined portion includes an inclined surface that is a surface of the inclined portion, and
the inclined surface is located on a first straight line that passes through a vertex of the lens portion and is parallel to the first direction, in a plan view.

3. The light-emitting device according to claim 2, wherein the inclined portion is located on a second straight line that passes through the vertex of the lens portion and is parallel to a second direction perpendicular to the first direction, in a plan view.

4. The light-emitting device according to claim 1, wherein the first lead and the second lead each include a connection end portion exposed from the mold resin member.

5. The light-emitting device according to claim 1, wherein,
in a plan view, an outer periphery of the fixing portion is greater than an outer periphery of the lens portion.

6. The light-emitting device according to claim 1, wherein the inclined portion includes an inclined surface that has substantially no protrusion and depression.

7. The light-emitting device according to claim 1, wherein the inclined portion includes an inclined surface that is curved.

8. The light-emitting device according to claim 1, wherein,
in a cross section taken along the first direction and a third direction, light passing through a connection point of the inclined portion to the lens portion of light emitted from the light-emitting element exits along a straight line passing through the connection point of the inclined portion to the lens portion and being parallel to the first direction, or exits below the parallel straight line, and
the third direction is orthogonal to the first direction and a second direction that is orthogonal to the first direction, and the third direction is a direction in which the first lead and the second lead extend.

9. The light-emitting device according to claim 1, wherein the first lead includes a recessed portion defined by a lateral wall and a bottom flat surface, and the light-emitting element is mounted on the bottom flat surface of the recessed portion.

10. The light-emitting device according to claim 9, wherein
the inclined portion is located above an upper edge of the lateral wall of the recessed portion.

11. The light-emitting device according to claim 9, wherein,
in a cross section taken along the first direction and a third direction, a connection point of the inclined portion to the fixing portion is located between a straight line passing through an upper end portion of the lateral wall of the recessed portion and being parallel to the first direction, and a straight line connecting an upper end portion of a lateral surface of the light-emitting element close to the inclined portion and the upper end portion of the lateral wall of the recessed portion, and
the third direction is orthogonal to the first direction and a second direction that is orthogonal to the first direction, and the third direction is a direction in which the first lead and the second lead extend.

12. The light-emitting device according to claim 9, wherein
an upper edge of the fixing portion is located at a same height as a height of an upper end portion of the recessed portion or above the upper end portion of the recessed portion.

13. The light-emitting device according to claim 3, wherein
an inclination angle of the inclined portion in the first direction is greater than an inclination angle of the inclined portion in the second direction.

14. The light-emitting device according to claim 1, wherein
the lens portion and the fixing portion have a substantially elliptical shape in a plan view.

15. The light-emitting device according to claim 1, wherein
a length of the fixing portion in the first direction is in a range from 3.4 mm to 4.4 mm in a plan view.

16. The light-emitting device according to claim 1, wherein
a length of the fixing portion in a second direction orthogonal to the first direction is in a range from 2.5 mm to 3.5 mm in a plan view.

17. The light-emitting device according to claim 1, wherein, a longest length of the lens portion in a third direction is in a range from 0.5 mm to 3.5 mm, the third direction being orthogonal to the first direction and a second direction that is orthogonal to the first direction, the third direction being a direction in which the first lead and the second lead extend.

18. The light-emitting device according to claim 1, wherein,
a longest length of the mold resin member in a third direction is in a range from 5.5 mm to 9.5 mm, the third direction being orthogonal to the first direction and a second direction that is orthogonal to the first direction, the third direction being a direction in which the first lead and the second lead extend.

19. The light-emitting device according to claim 1, wherein
the lens portion, the inclined portion, and the fixing portion are integrally formed.

20. A method for manufacturing a light-emitting device, comprising:
providing an intermediate body in which light-emitting elements are mounted on first leads of linked bodies, the linked bodies comprising one or more pairs of the first lead and a second lead that are connected repeatedly with a linked portion and arranged in a first direction, and the light-emitting element and the second lead are electrically connected via a conductive member in the one or more pairs;
supplying a material of a mold resin member in recesses in a casting case;
inserting the intermediate body into the recesses in which the material of the mold resin member is supplied, and forming the mold resin member configured to directly or indirectly cover the light-emitting elements for each pair of the first lead and the second lead; and
individually separating by cutting off the linked portion of the linked body so as to make the pairs each comprising the first lead and the second lead, wherein,
in the supplying of the material of the mold resin member in the recess, the casting case has a lens portion opening on a bottom side of the casting case, an inclined portion opening connected from the lens portion opening and spreading and inclined toward an opening side of the casting case, and a fixing portion opening connected from the inclined portion opening toward the opening side of the casting case,
a length in the first direction of the lens portion opening between a bottom of the lens portion opening and a first boundary between the lens portion opening and the inclined portion opening is larger than a length in the first direction of the inclined portion opening between the first boundary and a second boundary between the inclined portion opening and the fixing portion opening, and
in the forming of the mold resin member, the light-emitting element is disposed inside the fixing portion opening.

21. A light source device comprising:
a plurality of light-emitting devices; and
a mounting substrate on which the plurality of light-emitting devices are mounted, wherein
the plurality of light-emitting devices are each the light-emitting device according to claim 1,
the inclined portion of at least one of the plurality of light-emitting devices is disposed with the lens portion interposed therein in the first direction, and
the plurality of light-emitting devices are disposed in a direction parallel to the first direction.

22. The light source device according to claim 21, wherein
the plurality of light-emitting devices are disposed in a plurality of rows in parallel with the first direction, and
one set of three of the plurality of light-emitting devices across adjacent rows of the plurality of rows is mounted in a position where a straight line imaginarily connecting the centers of the three of the plurality of light-emitting devices makes a triangle.

23. The light source device according to claim 21, further comprising
a waterproof member disposed such that a part of the mold resin member is embedded between the plurality of light-emitting devices adjacent to each other.

24. The light-emitting device according to claim 1, wherein
in a second direction perpendicular to the first direction, a length in the second direction of the lens portion between a vertex of the lens portion and the first boundary is larger than a length in the second direction of the inclined portion between the first boundary and the second boundary.

* * * * *